(12) United States Patent
Eom

(10) Patent No.: US 10,818,690 B2
(45) Date of Patent: Oct. 27, 2020

(54) THREE-DIMENSIONAL SEMICONDUCTOR MEMORY DEVICE AND MANUFACTURING METHOD OF THE THREE-DIMENSIONAL SEMICONDUCTOR MEMORY DEVICE

(71) Applicant: SK hynix Inc., Icheon-si, Gyeonggi-do (KR)

(72) Inventor: Dae Sung Eom, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/286,045

(22) Filed: Feb. 26, 2019

(65) Prior Publication Data

US 2020/0027896 A1 Jan. 23, 2020

(30) Foreign Application Priority Data

Jul. 23, 2018 (KR) .................. 10-2018-0085644

(51) Int. Cl.
| | |
|---|---|
| *H01L 27/11582* | (2017.01) |
| *H01L 23/522* | (2006.01) |
| *H01L 21/768* | (2006.01) |
| *H01L 23/528* | (2006.01) |
| *H01L 23/532* | (2006.01) |
| *H01L 29/10* | (2006.01) |
| *H01L 21/311* | (2006.01) |
| *H01L 21/3105* | (2006.01) |
| *H01L 27/1157* | (2017.01) |

(52) U.S. Cl.
CPC .. *H01L 27/11582* (2013.01); *H01L 21/31053* (2013.01); *H01L 21/31144* (2013.01); *H01L 21/76802* (2013.01); *H01L 21/76877* (2013.01); *H01L 21/76897* (2013.01); *H01L 23/5226* (2013.01); *H01L 23/5283* (2013.01); *H01L 23/53266* (2013.01); *H01L 27/1157* (2013.01); *H01L 29/1037* (2013.01); *H01L 23/53271* (2013.01)

(58) Field of Classification Search
CPC ........... H01L 27/11582; H01L 23/5283; H01L 23/5226; H01L 29/1037; H01L 21/76802; H01L 21/76877; H01L 27/1157
USPC ......... 257/314, 315, 316; 438/216, 261, 591
See application file for complete search history.

(56) References Cited

U.S. PATENT DOCUMENTS 9,343,358 B1 * 5/2016 Xu .................. H01L 21/76877
9,449,924 B2    9/2016 Takaki

FOREIGN PATENT DOCUMENTS

KR    1020170046892 A    5/2017

* cited by examiner

*Primary Examiner* — Thinh T Nguyen
(74) *Attorney, Agent, or Firm* — William Park & Associates Ltd.

(57) ABSTRACT

A semiconductor device includes conductive patterns stacked and spaced apart from each other in a first direction to form a stepped structure, a stepped insulating layer overlapping the stepped structure, contact plugs extending through the stepped insulating layer in the first direction to contact respective contact portions of the conductive patterns, and barrier patterns disposed on sidewalls of the stepped insulating layer.

14 Claims, 20 Drawing Sheets

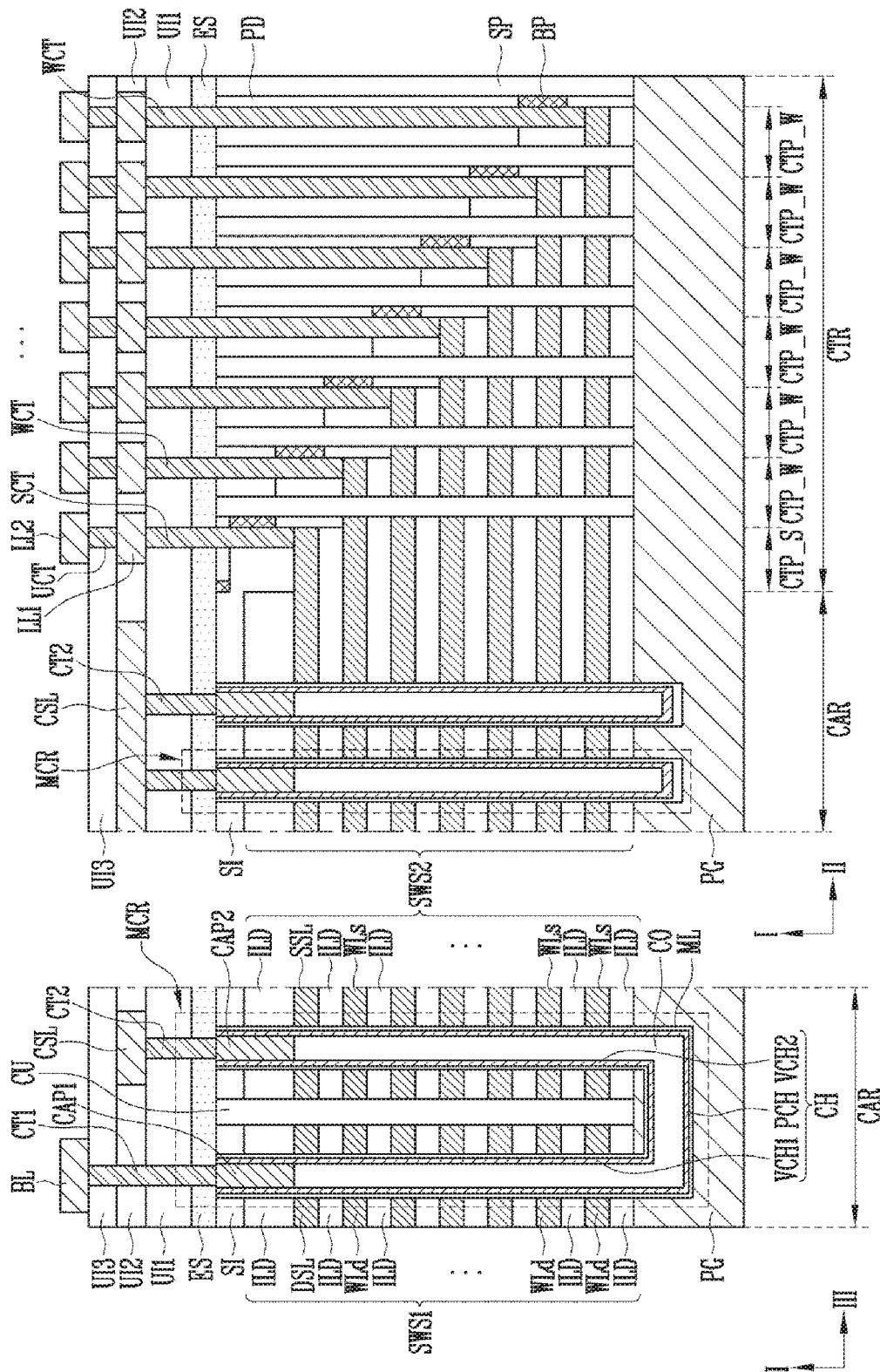

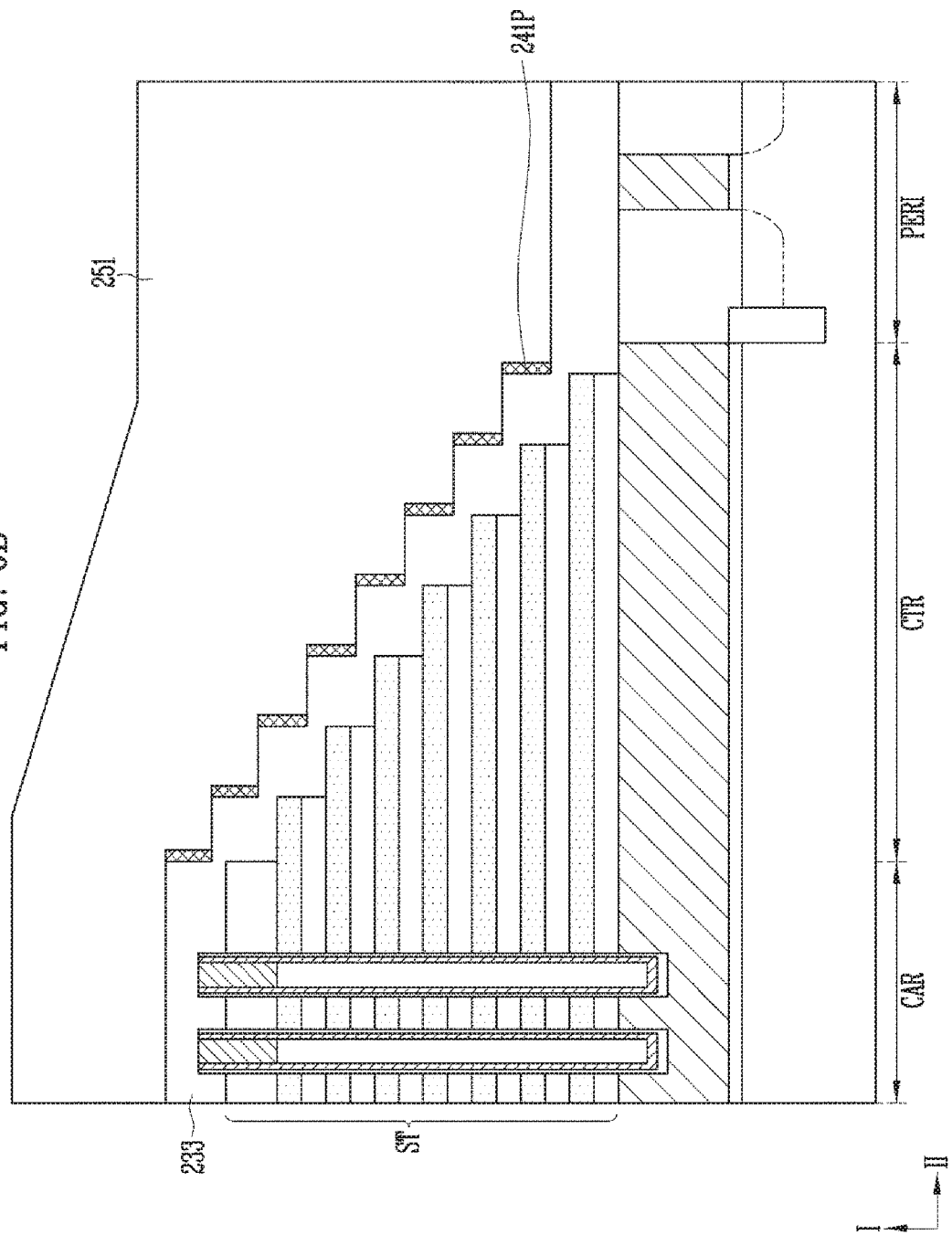

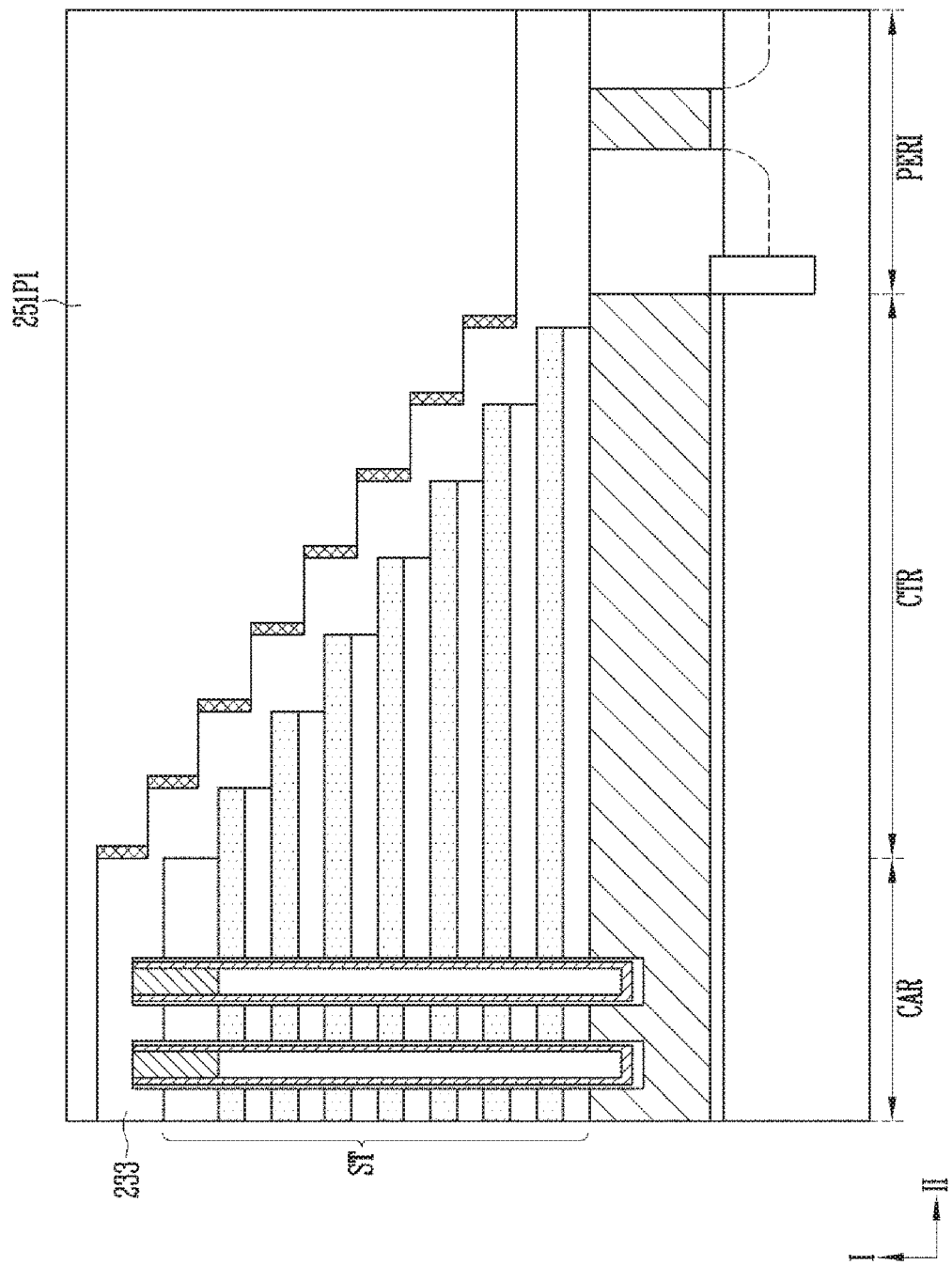

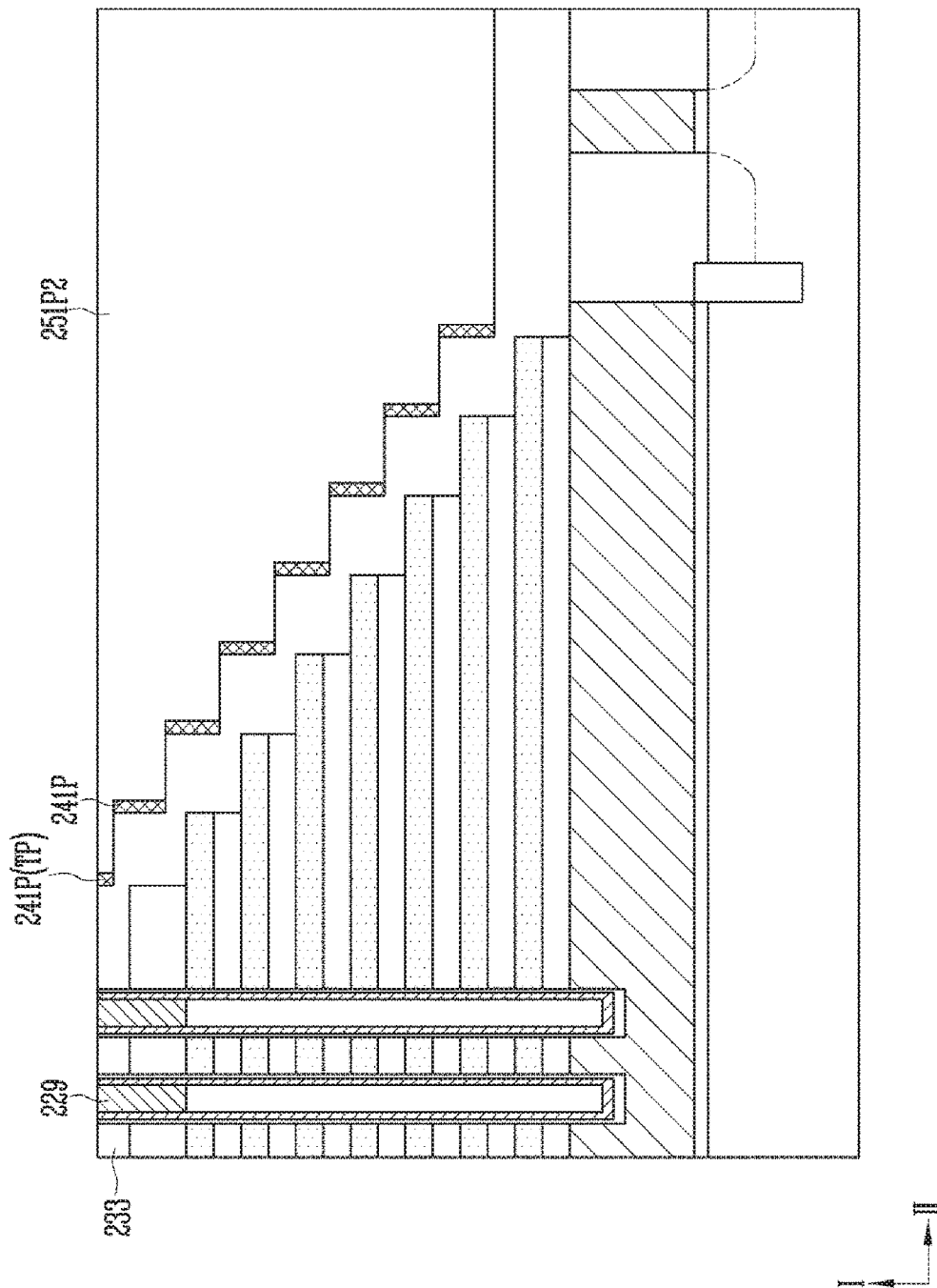

THREE-DIMENSIONAL SEMICONDUCTOR MEMORY DEVICE AND MANUFACTURING METHOD OF THE THREE-DIMENSIONAL SEMICONDUCTOR MEMORY DEVICE

CROSS-REFERENCE TO RELATED APPLICATION

The present application claims priority under 35 U.S.C. § 119(a) to Korean patent application number 10-2018-0085644, filed on Jul. 23, 2018, in the Korean Intellectual Property Office, the entire disclosure of which is incorporated herein by reference.

BACKGROUND

1. Technical Field

Various embodiments generally relate to a semiconductor device and a method of manufacturing the semiconductor device, and more particularly, to a semiconductor device including a conductive pattern contacting a contact plug and a method of manufacturing the semiconductor device.

2. Related Art

A semiconductor device may include a plurality of memory cells capable of storing data. The memory cells may be coupled to conductive patterns. Operating voltages for controlling the memory cells may be applied to the conductive patterns. The operating voltages applied from a peripheral circuit may be applied to the conductive patterns via contact plugs. Thereby, in manufacturing the semiconductor device, the contact plugs and the conductive patterns need to be correctly aligned.

When the contact plugs and the conductive patterns are misaligned, different conductive patterns may be coupled to a single contact plug. Therefore, a bridge in which neighboring conductive patterns are interconnected may result. Due to the bridge, an operational error may occur to the semiconductor device.

A three-dimensional semiconductor device which is configured such that memory cells are stacked in a vertical direction has been provided so as to improve integration density of the memory cells. In the three-dimensional semiconductor device, conductive patterns coupled to gates of the memory cells may be stacked to be spaced apart from each other. Due to these structural characteristics of the three-dimensional semiconductor device, bridges between the conductive patterns which are incurred by the misalignment between contact plugs may easily occur.

SUMMARY

According to an embodiment, a semiconductor device may include conductive patterns stacked and spaced apart from each other in a first direction to form a stepped structure, a stepped insulating layer overlapping the stepped structure, contact plugs extending through the stepped insulating layer in the first direction to contact respective contact portions of the conductive patterns, and barrier patterns disposed on sidewalls of the stepped insulating layer. The contact portions of the conductive patterns are exposed by the stepped structure.

According to an embodiment, a semiconductor device may include a conductive pattern including a contact portion and extending in a horizontal direction; a first barrier pattern disposed at a first level above the conductive pattern; a second barrier pattern disposed at a second level, lower than the first level, above the conductive pattern and spaced apart from the first barrier pattern in the horizontal direction; and a contact plug disposed between the first barrier pattern and the second barrier pattern and extending in a vertical direction to contact the contact portion.

According to an embodiment, a method of manufacturing a semiconductor device may include forming a stepped stack structure including first material layers and second material layers alternately stacked, forming a stepped insulating layer overlapping the stepped stack structure, forming barrier patterns spaced apart from each other on sidewalls of the stepped insulating layer, and forming contact plugs passing through the stepped insulating layer between the barrier patterns.

BRIEF DESCRIPTION OF THE DRAWINGS

FIG. 5 is a cross-sectional diagram illustrating a three-dimensional semiconductor device according to an embodiment of the present disclosure.

DETAILED DESCRIPTION

Figure 1A:
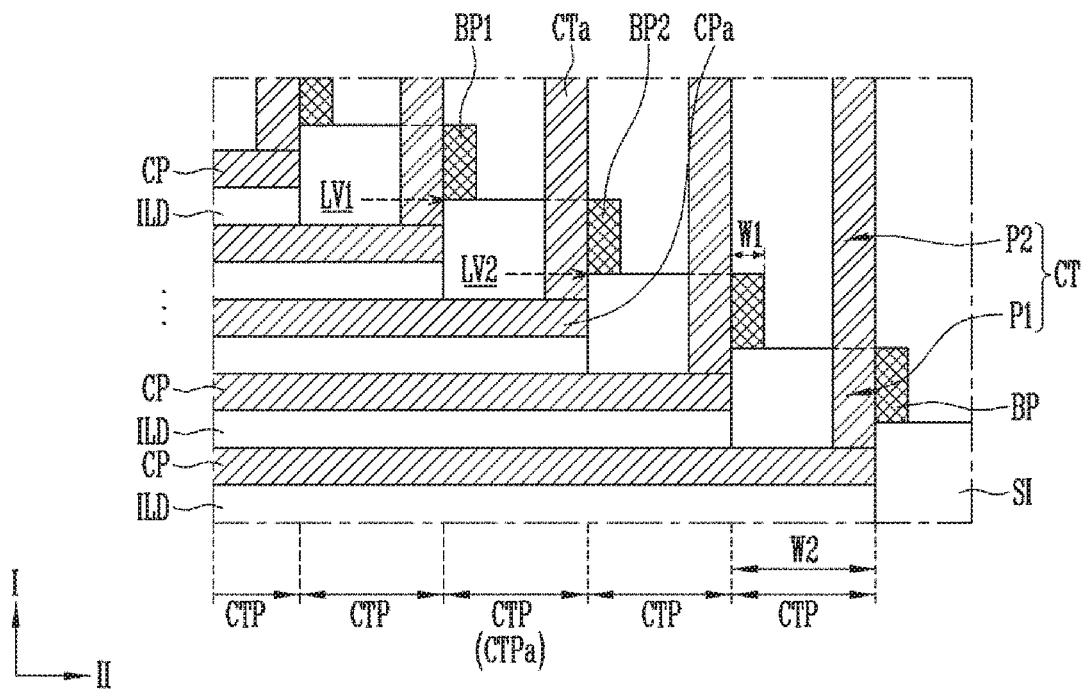
FIGS. 1A, 1B, 1C, and 1D are cross-sectional diagrams illustrating a semiconductor device according to embodiments of the present disclosure.

The technical spirit of the present disclosure may include examples of embodiments to which various modifications and changes may be applied and which include various forms. Hereinafter, various embodiments of the present disclosure are described in order for those skilled in the art to which the present disclosure pertains to be able to readily implement the technical spirit of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "between," "immediately between" or "adjacent to" and "directly adjacent to" may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part, or the combination those of described in the specification is present, but do not exclude a possibility of presence or addition of one or more other features, numbers, steps, operations, components, parts, or combinations thereof, in advance.

Embodiments of the present disclosure provide a semiconductor device that may be capable of improving operational reliability, and a method of manufacturing the semiconductor device.

FIGS. 1A to 1D are cross-sectional diagrams illustrating a semiconductor device according to embodiments of the present disclosure. FIGS. 1A to 1D are cross-sectional diagrams of a portion of the semiconductor device for illustrating alignment between contact portions of conductive patterns and contact plugs.

Referring to FIGS. 1A to 1D, a semiconductor device may include conductive patterns CP, contact plugs CT, and barrier patterns BP.

The conductive patterns CP may be stacked to be spaced apart from each other in a first direction I The conductive patterns CP may include contact portions CTP, respectively. The conductive patterns CP may be stacked on each other to form a stepped structure so as to expose the contact portions CTP. Each of interlayer insulating layers ILD may be disposed under each of the conductive patterns CP. In other words, the interlayer insulating layers ILD and the conductive patterns CP may be alternately stacked in the first direction I. To individually control the conductive patterns CP, the conductive patterns CP may be electrically insulated from each other with each of the interlayer insulating layers ILD interposed therebetween. Each of the conductive patterns CP may extend in a horizontal direction intersecting the first direction I. For example, each of the conductive patterns CP may extend in a second direction II intersecting the first direction I The contact portions CTP of the conductive patterns CP may be arranged in the second direction II (e.g., the direction in which the contact portions CTP extend). From a vertical point of view, the contact portions CTP of the conductive patterns CP may be arranged at different levels from each other.

The contact plugs CT may contact the contact portions CTP, respectively, and may extend in the first direction I. The contact plugs CT may pass through a stepped insulating layer SI covering the contact portions CTP. Each of the contact plugs CT may include a first portion P1 passing through the stepped insulating layer SI and a second portion P2 protruding from the first portion P1 further in the first direction I beyond the stepped insulating layer SI.

The stepped insulating layer SI may overlap a stepped structure defined by the conductive patterns CP and the interlayer insulating layers ILD. The stepped insulating layer SI may include a plurality of sidewalls defined by a stepped shape.

The barrier patterns BP may be disposed on the sidewalls of the stepped insulating layer SI, respectively. The barrier patterns BP may be spaced apart from each other in the second direction II. From a vertical point of view, the barrier patterns BP may be arranged at different levels from each other.

The barrier patterns BP may overlap the contact portions CTP, respectively, and the contact portions CTP may be opened between the barrier patterns BP.

In a plan view, each of the barrier patterns BP may have a first width W1 from a boundary between the contact portions CTP towards an end of each of the contact portions CTP. In the second direction II, the first width W1 may be smaller than a second width W2 of each of the contact portions CTP.

Each of the barrier patterns BP may include a material which may serve as an etch stop layer during a process for forming the contact plugs CT. More specifically, each of the barrier patterns BP may include a material different from that of the stepped insulating layer SI. In other words, materials for the barrier patterns BP and a material for the stepped insulating layer SI may have mutual etch selectivity such that each of the barrier patterns BP may serve as an etch stop layer when the stepped insulating layer SI is etched. For example, the stepped insulating layer SI may include an oxide layer, and the barrier patterns BP may include conductive materials or nitride layers. More specifically, the barrier patterns BP may include at least one of polysilicon, a nitride layer, a titanium nitride layer, and a metal layer.

The barrier patterns BP may serve as etch stop layers when the contact plugs CT are formed. Therefore, even when the contact plugs CT are overlapped with the barrier patterns BP, the contact plugs CT might not pass through the barrier patterns BP. Thereby, according to embodiments of the present disclosure, alignment margins of the contact plugs CT may be further secured by as much as the first widths W1 of the barrier patterns BP through the barrier patterns BP.

Each of the contact plugs CT may be disposed between each pair of the barrier patterns BP neighboring each other. Layouts of the contact plugs CT and the barrier patterns BP may vary within the margin of error for the process.

The contact plugs CT may include a first contact plug CTa. The barrier patterns BP may include a first barrier pattern BP1 and a second barrier pattern BP2 disposed at opposite sides of the first contact plug CTa. The first contact plug CTa may be any one of the contact plugs CT and the first barrier pattern BP1 and the second barrier pattern BP2 may be any one pair of the barrier patterns BP neighboring in the second direction II. Hereinafter, the first contact plug CTa, the first barrier pattern BP1, and the second barrier pattern BP2 may be described as examples for various layouts of the contact plugs CT and the barrier patterns BP. A layout of the first contact plug CTa may be applied to each of the contact plugs CT and layouts of the first and second barrier patterns BP1 and BP2 may be applied to the barrier patterns BP, respectively. A conductive pattern contacting the first contact plug CTa among the conductive patterns CP may be defined as a first conductive pattern CPa and a contact portion of the first conductive pattern CPa may be defined as a first contact portion CTPa.

The first barrier pattern BP1 may be disposed at a first level LV1 above the first conductive pattern CPa. The second barrier pattern BP2 may be spaced apart from the first barrier pattern BP1 in a plan view (e.g., spaced apart from the first barrier pattern BP1 in a horizontal direction) and may be disposed at a second level LV2 which is lower than the first level LV1 above the first conductive pattern CPa from a vertical point of view. The first conductive pattern CPa may extend in a horizontal direction and have the first contact portion CTPa overlapped with the first barrier pattern BP1. The first contact portion CTPa may extend to protrude further in the second direction II beyond the first barrier pattern BP1. In other words, in a plan view, the first contact portion CTPa may extend between the first barrier pattern BP1 and the second barrier pattern BP2. In an embodiment, the stepped insulating layer SI may be disposed between the first and second barrier patterns (BP1 and BP2) and the first conductive pattern CPa.

The first contact plug CTa may be disposed between the first barrier pattern BP1 and the second barrier pattern BP2 and may contact the first contact portion CTPa. In an embodiment, the first contact plug CTa may extend in a vertical direction to contact the first contact portion CTPa.

Referring to FIG. 1A, the first contact plug CTa may contact a sidewall of the second barrier pattern BP2 and may be spaced apart from the first barrier pattern BP1. More specifically, the first portion P1 of the first contact plug CTa may contact the sidewall of the second barrier pattern BP2 and pass through the stepped insulating layer SI. The second portion P2 of the first contact plug CTa may rectilinearly protrude from the first portion P1 in the first direction I without overlapping a top surface of the second barrier pattern BP2.

Although not illustrated in FIG. 1A, the first contact plug CTa may contact a sidewall of the first barrier pattern BP1 and may rectilinearly protrude in the first direction I to be spaced apart from the second barrier pattern BP2.

Figure 1B:
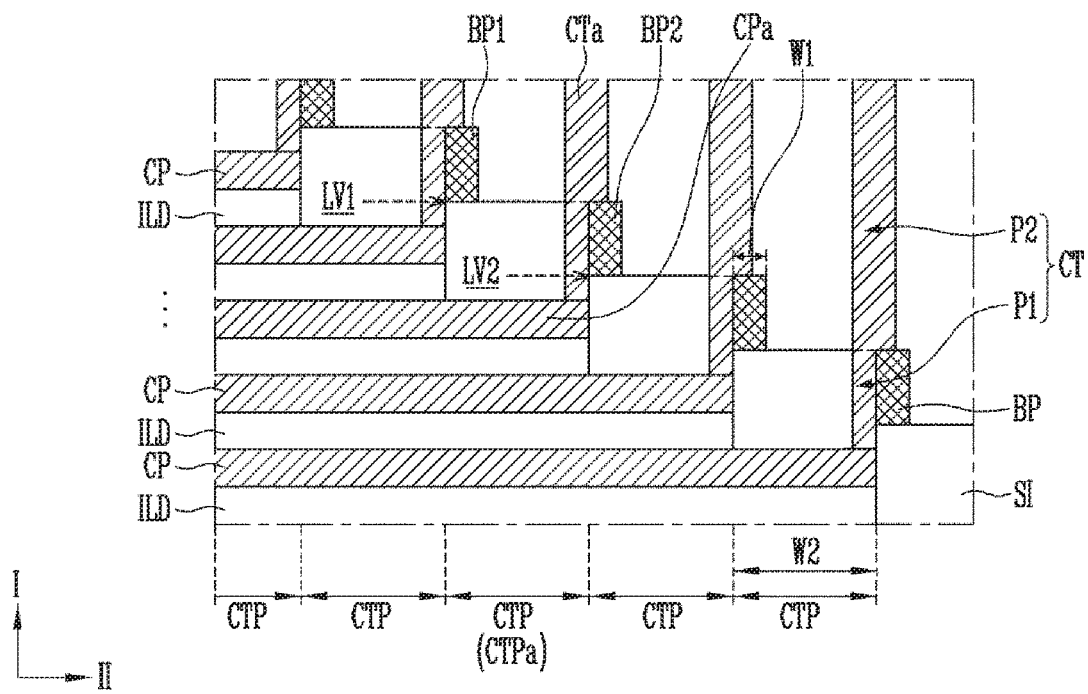

Referring to FIG. 1B, the first contact plug CTa may overlap the top surface of the second barrier pattern BP2 as well as contact the sidewall of the second barrier pattern BP2 and be spaced apart from the first barrier pattern BP1. More specifically, the first portion P1 of the first contact plug CTa may contact the sidewall of the second barrier pattern BP2 and pass through the stepped insulating layer SI. The second portion P2 of the first contact plug CTa may protrude from the first portion P1 in the second direction II so as to overlap the top surface of the second barrier pattern BP2. The second portion P2 of the first contact plug CTa may extend in the first direction I. The first contact plug CTa may overlap the top surface of the second barrier pattern BP2 within a range of the first width W1 secured by the second barrier pattern BP2. During a manufacturing process of a contact hole filled with the first contact plug CTa, the second barrier pattern BP2 may serve as an etch stop layer. Thereby, even when the second portion P2 of the first contact plug CTa overlaps the top surface of the second barrier pattern BP2, the first contact plug CTa might not pass through the second barrier pattern BP2.

Figure 1C:
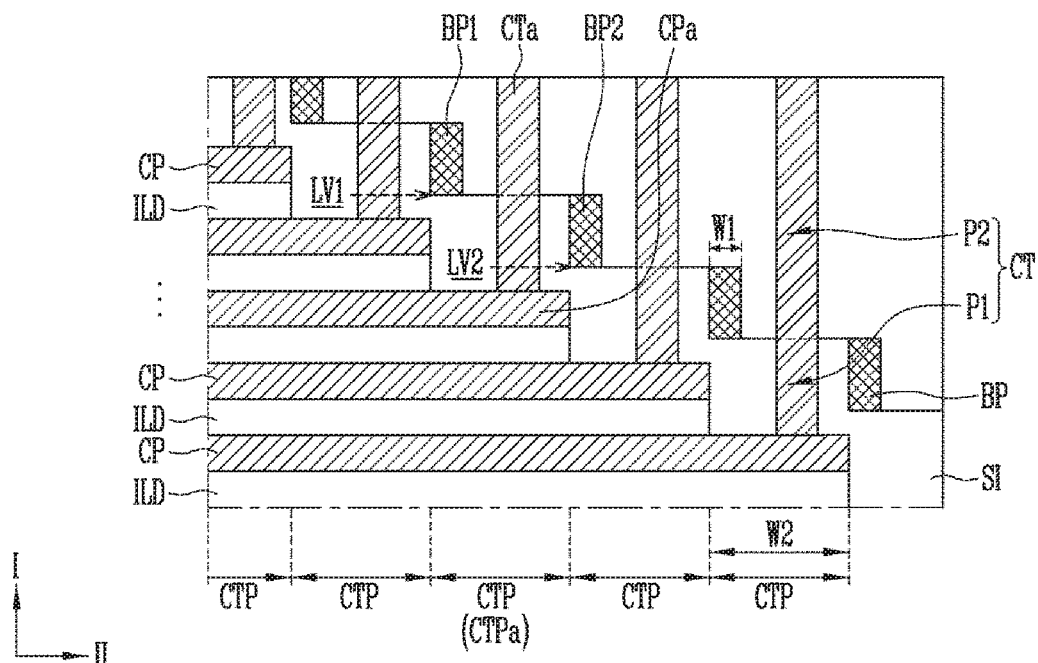

Referring to FIG. 1C, the first contact plug CTa may pass through the stepped insulating layer SI to contact the first contact portion CTPa at a position spaced apart from the first barrier pattern BP1 and the second barrier pattern BP2.

Figure 1D:
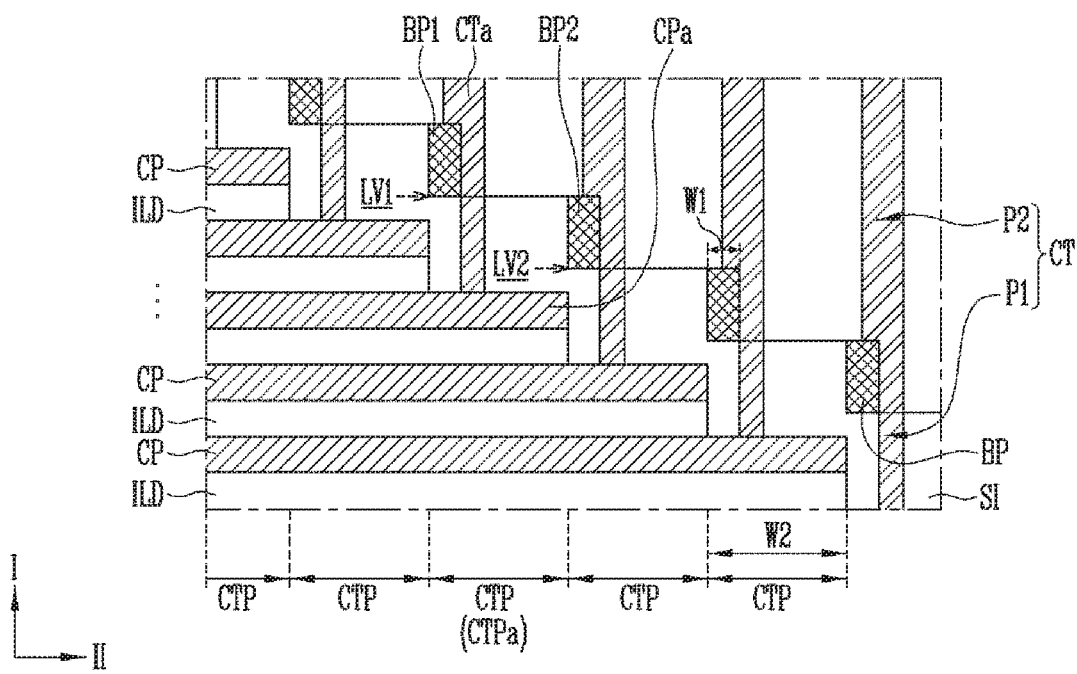

Referring to FIG. 1D, the first contact plug CTa may overlap a top surface of the first barrier pattern BP1 as well as contact the sidewall of the first barrier pattern BP1 and be spaced apart from the second barrier pattern BP2. More specifically, the first portion P1 of the first contact plug CTa may contact the sidewall of the first barrier pattern BP1 and pass through the stepped insulating layer SI. The second portion P2 of the first contact plug CTa may protrude from the first portion P1 in a horizontal direction so as to overlap the top surface of the first barrier pattern BP1. The second portion P2 of the first contact plug CTa may extend in the first direction I. The first contact plug CTa may overlap the top surface of the first barrier pattern BP1 within a range of the first width W1 secured by the first barrier pattern BP1. During a manufacturing process of a contact hole filled with the first contact plug CTa, the first barrier pattern BP1 may serve as an etch stop layer. Thereby, even when the second portion P2 of the first contact plug CTa overlaps the top surface of the first barrier pattern BP1, the first contact plug CTa might not pass through the first barrier pattern BP1.

When the barrier patterns BP shown in FIG. 1A, 1B, or 1D include a conductive material, each of the barrier patterns BP may contact each of the contact plugs CT. Therefore, the barrier patterns BP may lower resistances of the contact plugs CT.

The structures illustrated in FIGS. 1A to 1D may be applied to various semiconductor devices including memory cells arranged in a two-dimensional structure or various semiconductor devices including memory cells arranged in a three-dimensional structure.

Figure 2A:
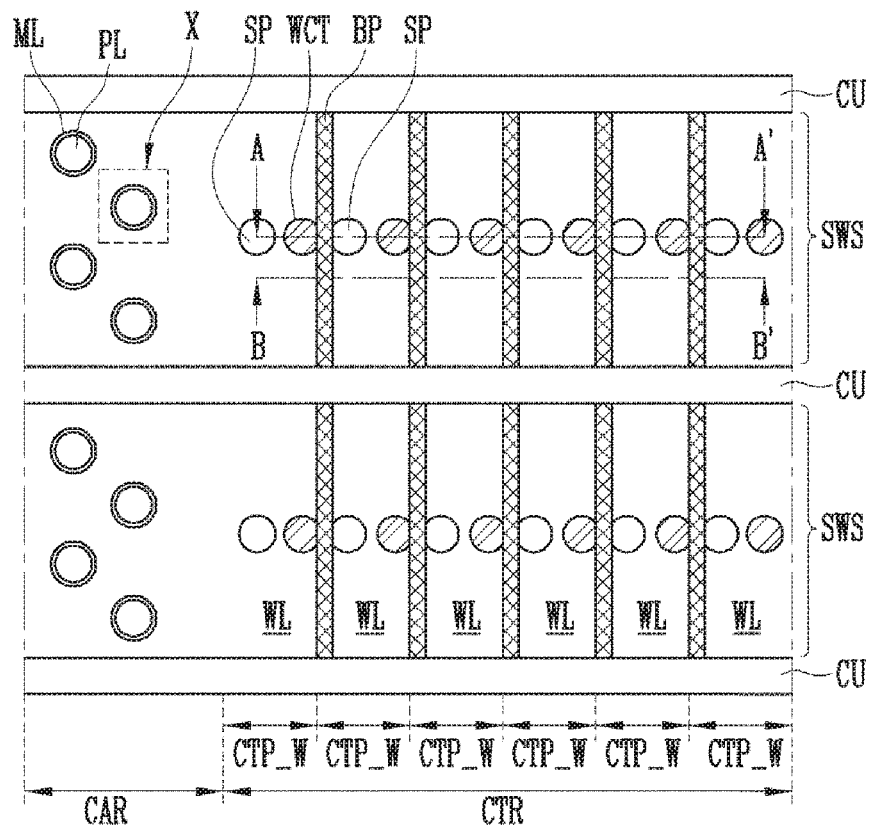
FIGS. 2A and 2B are diagrams illustrating a three-dimensional semiconductor device according to an embodiment of the present disclosure.
Figure 2B:
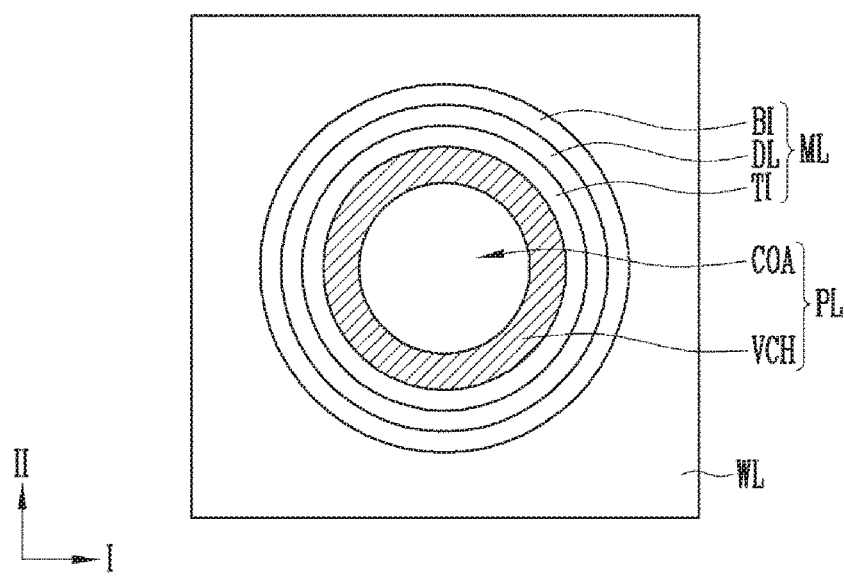

FIGS. 2A and 2B are diagrams illustrating a three-dimensional semiconductor device according to an embodiment of the present disclosure. More specifically, FIG. 2A is a plan view illustrating word lines of a three-dimensional semiconductor device according to an embodiment and FIG. 2B is an enlarged view of an X region illustrated in FIG. 2A.

Referring to FIG. 2A, a three-dimensional semiconductor device according to an embodiment of the present disclosure may include stepped stack structures SWS divided by a cutting structure CU. Each of the stepped stack structures SWS may include a plurality of word lines WL stacked to be spaced apart from each other. The word lines WL may be conductive patterns extending from gates of memory cells. Each of the stepped stack structures SWS may include a cell array region CAR and a contact region CTR.

The cell array region CAR of each of the stepped stack structures SWS may be penetrated by channel pillars PL. An outer wall of each of the channel pillars PL may be enclosed by a multilayer memory layer ML. The contact region CTR of each of the stepped stack structures SWS may include contact portions CTP_W of the word lines WL. The word lines WL may form a stepped structure so as to expose the contact portions CTP_W.

The three-dimensional semiconductor device according to an embodiment of the present disclosure may include the barrier patterns BP. The barrier patterns BP may be divided from each other by the cutting structure CU. In a plan view, the barrier patterns BP may extend along sidewalls of the word lines WL.

The three-dimensional semiconductor device according to an embodiment of the present disclosure may include contact plugs WCT contacting the word lines WL, respectively. Each of the contact plugs WCT may be disposed on an end of each of the contact portions CTP_W. The contact plugs WCT may be coupled to the barrier patterns BP, respectively. Each of the stepped stack structures SWS may be penetrated by supporting structures SP. Each of the barrier patterns BP may be disposed between one of the supporting structures SP and one of the contact plugs WCT. The supporting structures SP and the contact plugs WCT may be collinearly arranged. However, embodiments of the present disclosure are not limited thereto. For example, the supporting structures SP and the contact plugs WCT may be arranged in a zigzag format or may be obliquely arranged.

Referring to FIG. 2B, each of the channel pillars PL may include a vertical channel VCH including a semiconductor layer. For example, the vertical channel VCH may include a silicon layer. The vertical channel VCH may have various structures. For example, the vertical channel VCH may have a ring-shaped cross section defining a core region COA. The core region COA may be completely filled with the vertical channel VCH. In another example, the core region COA may be filled with at least one of an insulating layer and a doped semiconductor layer.

The multilayer memory layer ML may be disposed between the channel pillar PL and the word line WL. The multilayer memory layer ML may include a tunnel insulating layer TI configured to enclose the vertical channel VCH, a data storage layer DL configured to enclose the tunnel insulating layer TI, and a blocking insulating layer BI configured to enclose the data storage layer DL. The data storage layer DL may store data which is changed using Fowler-Nordheim tunneling caused by a voltage difference between the word line WL and the vertical channel VCH. For this operation, the data storage layer DL may include various materials, for example, a nitride layer capable of trapping charges. However, embodiments of the present disclosure are not limited thereto, and the data storage layer DL may include silicon, a phase-change material, a nanodot, and the like. The blocking insulating layer BI may include an oxide layer capable of blocking charges. The tunnel insulating layer TI may include a silicon oxide layer in which charge tunneling is available.

The memory cell may be formed at an intersection of the word line WL and the vertical channel VCH. The vertical channel VCH may serve as a channel of the memory cells.

Figure 3A:
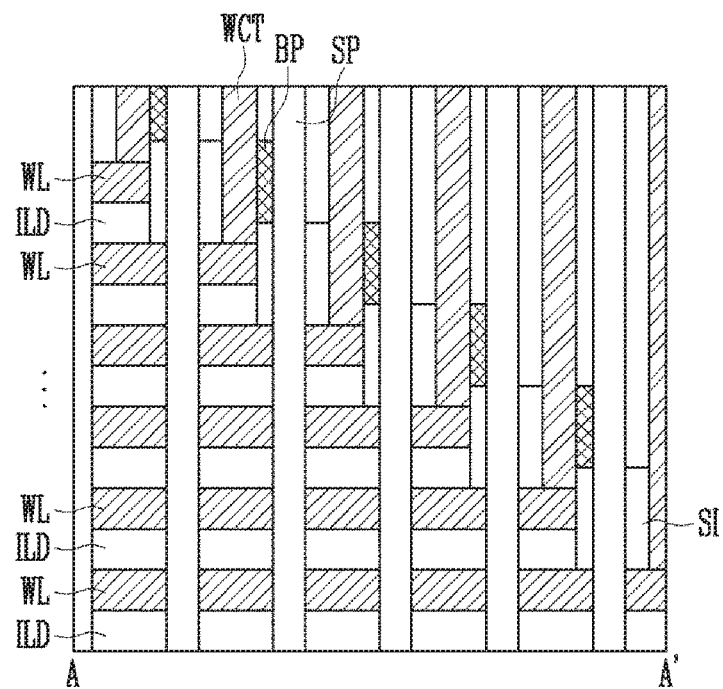
FIGS. 3A and 3B are cross-sectional diagrams illustrating the three-dimensional semiconductor device illustrated in FIG. 2A.
Figure 3B:
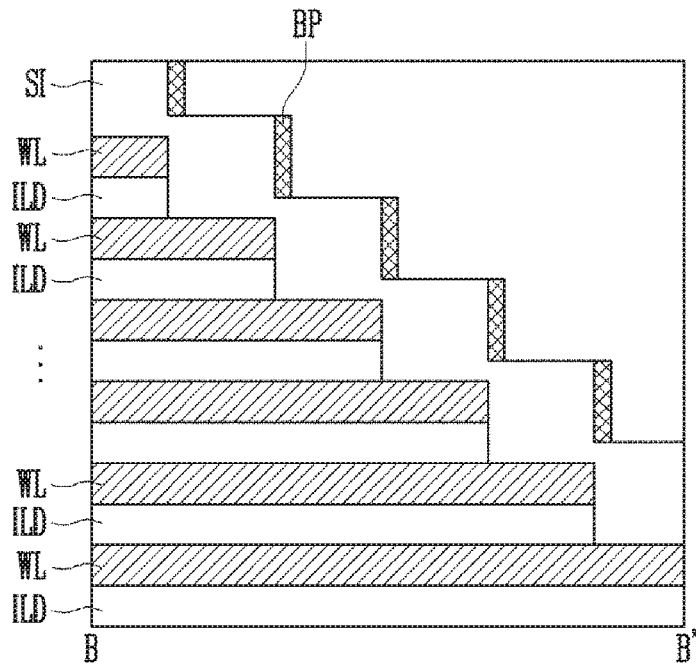

FIGS. 3A and 3B are cross-sectional diagrams illustrating the three-dimensional semiconductor device illustrated in FIG. 2A. More specifically, FIG. 3A is a cross-sectional diagram taken along line A-A' of FIG. 2A, and FIG. 3B is a cross-sectional diagram taken along line B-B' of FIG. 2A.

Referring to FIGS. 3A and 3B, each of the interlayer insulating layers ILD may be disposed between each pair of the word lines WL neighboring each other. A stacking structure of the interlayer insulating layers ILD and the word lines WL may be the same as a stacking structure of the interlayer insulating layers ILD and the conductive patterns CP which is illustrated in FIGS. 1A to 1D.

The stacking structure of the interlayer insulating layers ILD and the word lines WL may be covered by the stepped insulating layer SI. The stepped insulating layer SI may have the same structure and include the same material as the stepped insulating layer SI illustrated in FIGS. 1A to 1D. A portion of the stepped insulating layer SI may be penetrated by the contact plugs WCT as illustrated in FIG. 3A. Arrangements of the contact plugs WCT are not limited to the example illustrated in FIG. 3A, and may be the same as one of the arrangements of the contact plugs CT as illustrated in FIGS. 1A to 1D.

The barrier patterns BP may be formed on sidewalls of the stepped insulating layer SI. The barrier patterns BP may include the same material and have the same layout as the barrier patterns BP illustrated in FIGS. 1A to 1D.

The stacking structure of the interlayer insulating layers ILD and the word lines WL may be further penetrated by the supporting structures SP as shown in FIG. 3A. The supporting structures SP may extend in a stacking direction of the interlayer insulating layers ILD and the word lines WL, and support the stacking structure when a three-dimensional semiconductor device is formed. The supporting structures SP may include insulating materials. For example, the supporting structures SP may include oxide layers. In some embodiments, the supporting structures SP may be omitted.

Referring to FIG. 3B, an interface between each of the sidewalls of the stepped insulating layer SI and each of the barrier patterns BP may be aligned with the sidewall of each of the word lines WL.

FIGS. 4A to 4H are cross-sectional diagrams illustrating a method of manufacturing a semiconductor device according to an embodiment of the present disclosure. More specifically, FIGS. 4A to 4H are cross-sectional diagrams taken along line A-A' of FIG. 2A and which illustrate phased manufacturing processes.

Figure 4A:
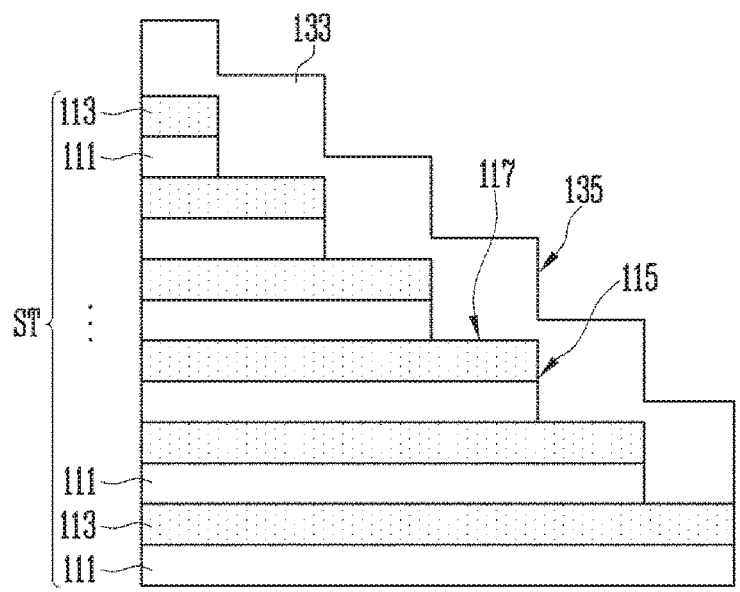
FIGS. 4A, 4B, 4C, 4D, 4E, 4F, 4G, and 4H are cross-sectional diagrams illustrating a method of manufacturing a semiconductor device according to an embodiment of the present disclosure.

Referring to FIG. 4A, a stepped stack structure ST including first material layers 111 and second material layers 113 which are alternately stacked on a lower structure (not illustrated) which is formed beforehand. The lower structure may include various compositions. According to an embodiment, the lower structure may include a pipe gate PG illustrated in FIG. 5. According to another embodiment, the lower structure may include a source dopant region SDA illustrated in FIGS. 7A and 7B. According to another embodiment, the lower structure may include a dopant region DA1 illustrated in FIG. 7C.

The first material layers 111 and the second material layers 113 may include different materials from each other.

According to a first embodiment, the first material layers 111 might not only insulate conductive patterns from each other, but also include materials having a high etch resistance with respect to an etching material to be used in a subsequent etching process for selectively removing the second material layers 113. For example, the first material layers 111 may include oxide layers such as silicon oxide layers, and the second material layers 113 may include nitride layers such as silicon nitride layers. The first material layers 111 may remain as interlayer insulating layers after a manufacturing process of a semiconductor device is completed, and the second material layers 113 may be replaced with conductive patterns in a subsequent process.

According to a second embodiment, the first material layers 111 may include materials which may insulate between the conductive patterns, and the second material layers 113 may include various conductive materials for the conductive patterns. For example, the first material layers 111 may include oxide layers such as silicon oxide layers, and the second material layers 113 may include at least one of a silicon layer, a metal layer, and a metal silicide layer. In addition, the second material layers 113 may further include barrier metal layers. The first material layers 111 may remain as interlayer insulating layers after a manufacturing process of a semiconductor device is completed, and the second material layers 113 may remain as conductive patterns after the manufacturing process of the semiconductor device is completed.

According to a third embodiment, the second material layers 113 may include conductive materials for conductive patterns, and the first material layers 111 may include materials which may be selectively removed while minimizing losses of the second material layers 113 when the first material layers 111 are selectively removed. For example, the first material layers 111 may include undoped silicon layers and the second material layers 113 may include doped silicon layers. The first material layers 111 may be replaced with interlayer insulating layers in a subsequent process and the second material layers 113 may remain as conductive patterns after a manufacturing process of a semiconductor device is completed.

The first material layers 111 and the second material layers 113 may be patterned into a stepped shape to form the stepped stack structure ST. Respective levels of the first material layers 111 or the second material layers 113 may be exposed through the steps of the stepped stack structure ST.

Subsequently, a stepped insulating layer 133 overlapping the stepped stack structure ST may be formed. The stepped insulating layer 133 may have sidewalls 135 aligned with step sidewalls 115 of the stepped stack structure ST, respectively. The stepped insulating layer 133 may have a thickness on each of top surfaces 117 of the stepped stack structure ST which is greater than a thickness on each of the step sidewalls 115. The stepped insulating layer 133 may include an oxide layer.

Figure 4B:
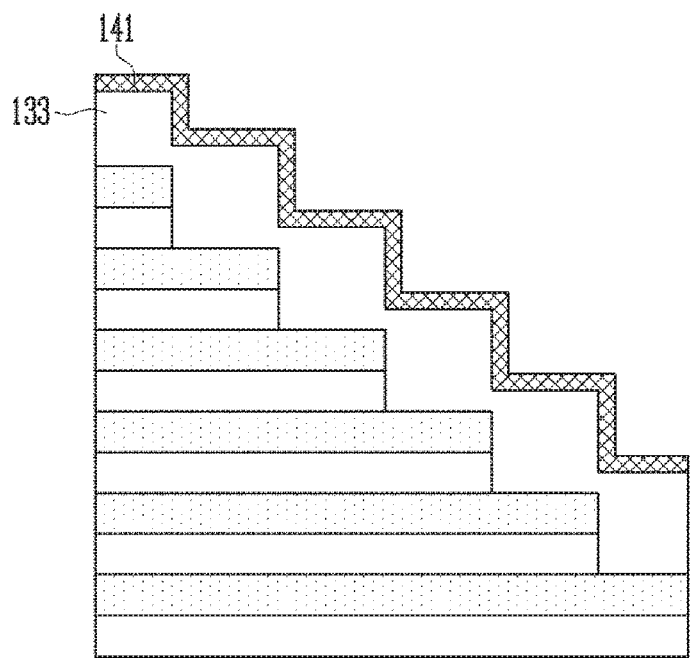

Referring to FIG. 4B, a barrier layer 141 may be formed on a surface of the stepped insulating layer 133. The barrier layer 141 may include a material having a different etch rate from that of each of the stepped insulating layer 133, an interlayer insulating layer, and a planarized insulating pattern to be formed later. For example, the barrier layer 141 may include a conductive material or an insulating material. More specifically, the barrier layer 141 may include at least one of a nitride layer, a polysilicon layer, a titanium nitride layer, and a metal layer. The barrier layer 141 may be conformally deposited on the surface of the stepped insulating layer 133.

Figure 4C:
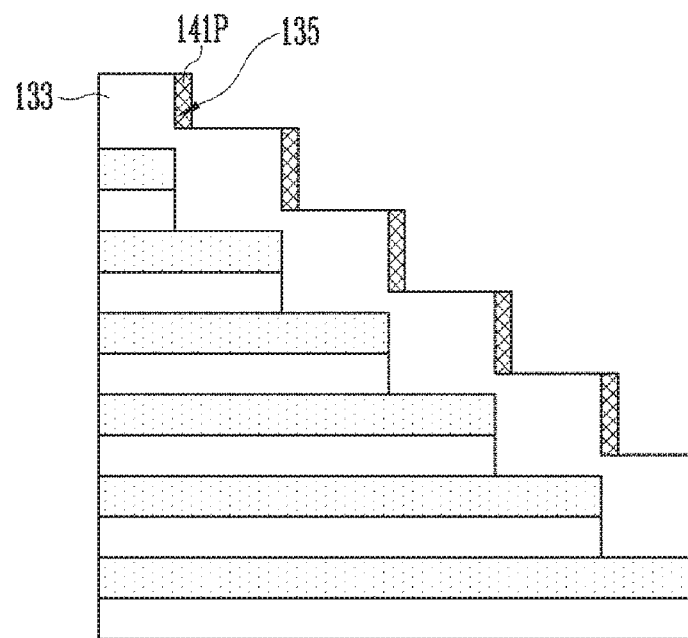

Referring to FIG. 4C, the barrier layer 141 illustrated in FIG. 4B may be etched to expose top surfaces of the stepped insulating layer 133. Thereby, barrier patterns 141P may be formed on the sidewalls 135 of the stepped insulating layer 133, and the barrier patterns 141P may be spaced apart from each other.

Figure 4D:
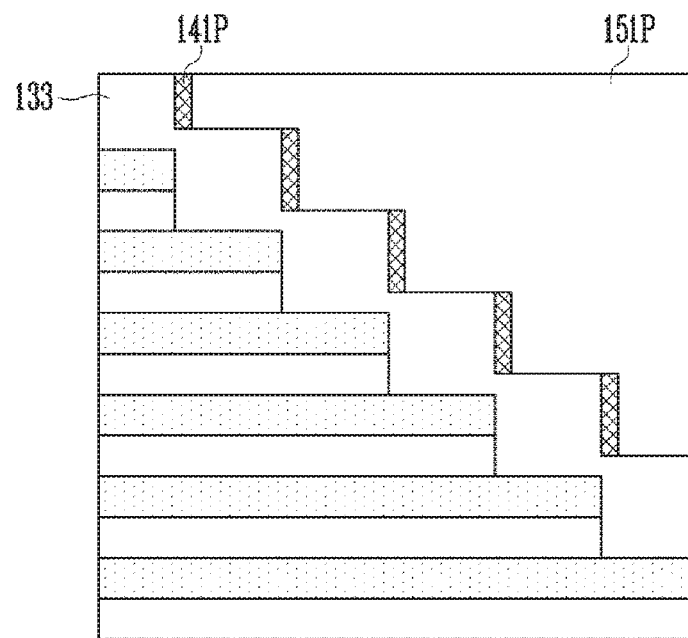

Referring to FIG. 4D, a planarized insulating pattern 151P covering the stepped insulating layer 133 and the barrier patterns 141P may be formed. The planarized insulating pattern 151P may include an oxide material and have a flat surface.

Figure 4E:
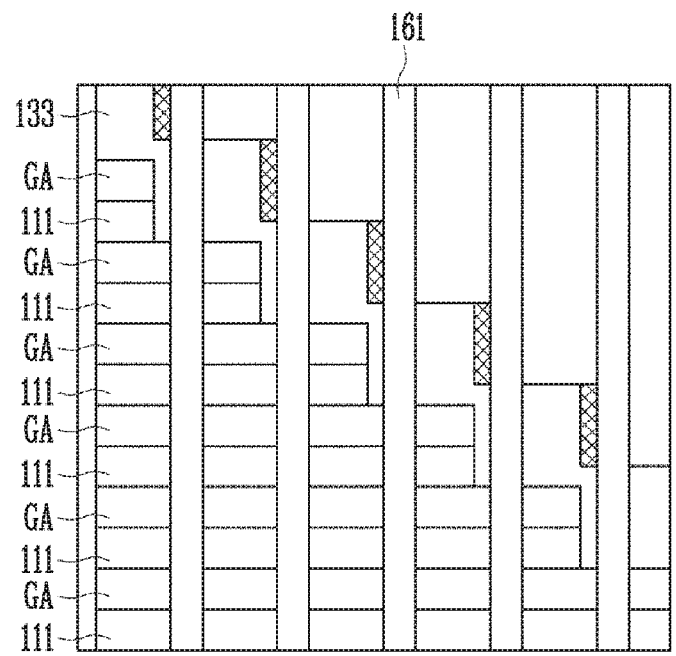
Figure 4F:
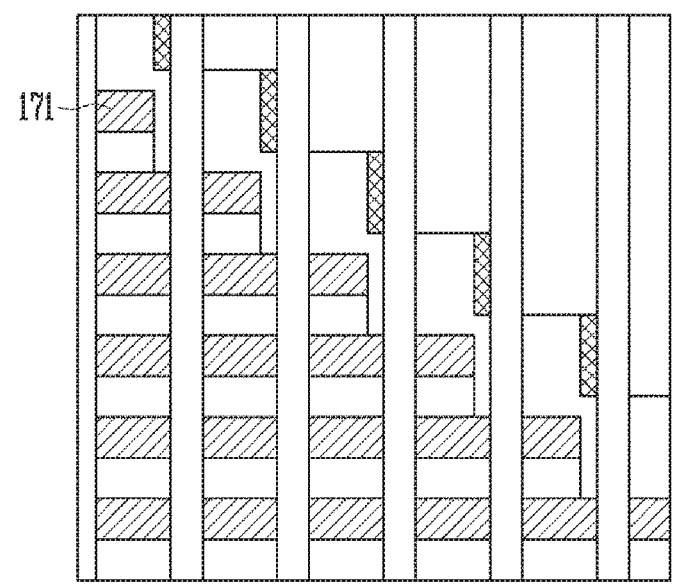

FIGS. 4E and 4F illustrate the first embodiment described with reference to FIG. 4A as an example.

Referring to FIG. 4E, supporting structures 161 may be formed. A manufacturing process of the supporting structures 161 may be omitted in some embodiments. For example, according to the second embodiment described with reference to FIG. 4A, the manufacturing process of the supporting structures 161 may be omitted.

After forming the supporting structures 161, the second material layers 113 according to the first embodiment described with reference to FIG. 4A may be selectively removed. Thereby, gate regions GA may be opened between the first material layers 111, and between the uppermost first material layer 111 and the stepped insulating layer 133. Forming the gate regions GA may include forming a slit which constitutes the cutting structure CU illustrated in FIG. 2A and selectively removing the second material layers through the slit.

Referring to FIG. 4F, the gate regions GA illustrated in FIG. 4E may be filled with conductive patterns 171, respectively. Forming the conductive patterns 171 may include filling the gate regions GA illustrated in FIG. 4E with a conductive material and dividing the conductive material into a plurality of conductive patterns 171.

The conductive material may flow in the gate regions GA illustrated in FIG. 4E through the slit of the cutting structure CU illustrated in FIG. 2A. Each of the conductive patterns 171 may include at least one of a doped silicon layer, a metal silicide layer, and a metal layer. A low-resistance metal such as tungsten may be used for each of the conductive patterns 171 for low-resistance wiring. Each of the conductive patterns 171 may further include a barrier metal layer such as a titanium nitride layer, a tungsten nitride layer, and a tantalum nitride layer. The conductive patterns 171 may serve as the word lines WL illustrated in FIGS. 2A, 2B, 3A, and 3B.

Although not illustrated, after the conductive patterns 171 are formed, the slit of the cutting structure may be filled with an insulating material. Thereby, the cutting structure CU of FIG. 2A which includes the slit filled with the insulating material may be formed.

FIGS. 4E and 4F illustrate the first embodiment described with reference to FIG. 4A in which the second material layers are replaced with the conductive patterns. However, the present disclosure is not limited thereto.

For example, according to the second embodiment described with reference to FIG. 4A, the process for replacing the second material layers with the conductive patterns may be omitted, and a subsequent process illustrated in FIG. 4G may be performed. In another example, according to the third embodiment described with reference to FIG. 4A, the subsequent process illustrated in FIG. 4G may be performed after replacing the first material layers with the insulating layers.

Figure 4G:
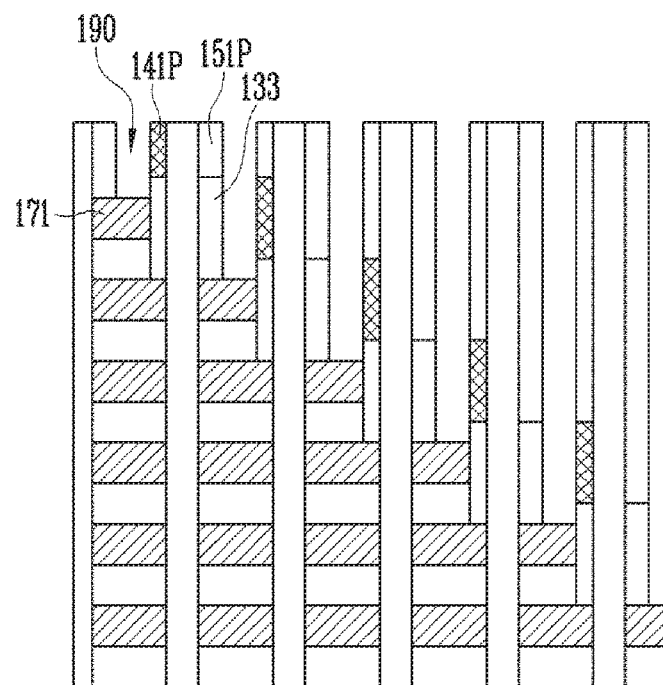

Referring to FIG. 4G, contact holes 190 passing through the planarized insulating pattern 151P and the stepped insulating layer 133 may be formed. Each of the contact holes 190 may expose a portion of each of the conductive patterns 171 which constitute the steps. When the planarized insulating pattern 151P and the stepped insulating layer 133 are etched to form the contact holes 190, the barrier patterns 141P may serve as etch stop layers. Each of the contact holes 190 may be disposed between each pair of neighboring first and second barrier patterns among the barrier patterns 141P. The contact holes 190 are not limited to the described embodiment illustrated in FIG. 4G, and may have various layouts within the margin of error for the process as the contact plugs illustrated in FIGS. 1A to 1D.

Figure 4H:
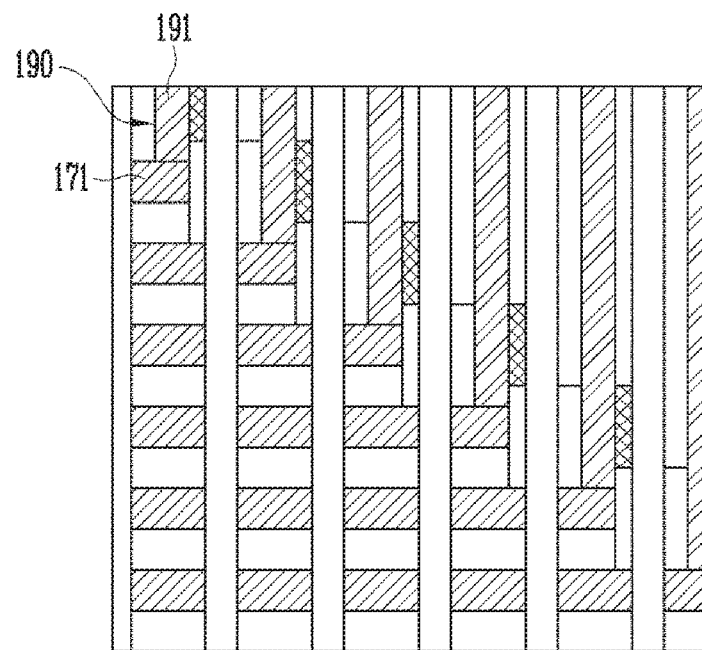

Referring to FIG. 4H, each of the contact holes 190 may be filled with a conductive material. Thereby, contact plugs 191 contacting the conductive patterns 171 may be formed in the contact holes 190. For example, referring to FIGS. 4G and 4H, contact plugs 191 passing through the stepped insulating layer 133 may be formed between the barrier patterns 141P.

FIG. 5 is a cross-sectional diagram illustrating a three-dimensional semiconductor device according to an embodiment of the present disclosure. A semiconductor device illustrated in FIG. 5 may include a structure illustrated in FIGS. 2A and 2B.

Referring to FIG. 5, the three-dimensional memory device may include a memory string MCR. The memory string MCR may be defined along a pipe channel PCH and at least one pair of first and second vertical channels VCH1 and VCH2 coupled to the pipe channel PCH. Although FIG. 5 illustrates the memory string MCR including the first vertical channel VCH1 and the second vertical channel VCH2 coupled to the pipe channel PCH and defined as a U type for convenience of explanation, the memory string MCR may have various structures such as a W type.

Each of the first vertical channel VCH1 and the second vertical channel VCH2 may extend in the first direction I. The first vertical channel VCH1 may pass through a first stepped stack structure SWS1 and the second vertical channel VCH2 may pass through a second stepped stack structure SWS2. Each of the first stepped stack structure SWS1 and the second stepped stack structure SWS2 may include contact portions CTP_S and CTP_W. The contact portions CTP_S and CTP_W may be arranged in the second direction II intersecting the first direction I. Although FIG. 5 illustrates the contact portions CTP_S and CTP_W of the second stepped stack structure SWS2 only, the first stepped stack structure SWS1 may also include contact portions arranged in the second direction II.

The first stepped stack structure SWS1 and the second stepped stack structure SWS2 may have the same stacking structure. The first stepped stack structure SWS1 and the second stepped stack structure SWS2 may be separated from each other by the cutting structure CU and may neighbor each other in a third direction III. The third direction III may intersect the first direction I and the second direction II.

A stacking structure of each of the first stepped stack structure SWS1 and the second stepped stack structure SWS2 may include the interlayer insulating layers ILD and conductive patterns DSL, WLd, SSL, and WLs which are alternately stacked. More specifically, the conductive patterns of the first stepped stack structure SWS1 may include the drain side word lines WLd stacked to be spaced apart from each other and at least one drain select line DSL disposed above the drain side word lines WLd. The conductive patterns of the second stepped stack structure SWS2 may include the source side word lines WLs stacked to be spaced apart from each other and at least one source select line SSL disposed above the source side word lines WLs.

The first stepped stack structure SWS1 and the second stepped stack structure SWS2 may be covered with the stepped insulating layer SI, and the stepped insulating layer SI may be penetrated by the cutting structure CU. The first and second vertical channels VCH1 and VCH2 may extend to pass through the stepped insulating layer SI.

The pipe channel PCH may be embedded in the pipe gate PG disposed under the first stepped stack structure SWS1 and the second stepped stack structure SWS2. The pipe gate PG may include various conductive materials. For example, the pipe gate PG may include doped silicon layers stacked as a multilayer. The cutting structure CU may overlap the pipe gate PG.

The pipe channel PCH may be integrated with the first vertical channel VCH1 and the second vertical channel VCH2. As described above, a channel layer CH including the pipe channel PCH, the first vertical channel VCH1, and the second vertical channel VCH2 may serve as a channel of the memory string MCR. The channel layer CH may include a semiconductor layer such as a silicon layer.

The multilayer memory layer ML may extend along an outer wall of the channel layer CH. In an embodiment, the multilayer memory layer ML may be disposed between each of the conductive patterns (DSL, WLd, SSL, and WLs) and the channel layer CH. The multilayer memory layer ML may include material layers described with reference to FIG. 2B. A core region of the channel layer CH may be filled with a core insulating layer CO. The core insulating layer CO may have a smaller height than the first vertical channel VCH1 and the second vertical channel VCH2. First and second doped semiconductor patterns CAP1 and CAP2 may be disposed at opposite sides of the core insulating layer CO. The first doped semiconductor pattern CAP1 may serve as a drain junction. The second doped semiconductor pattern CAP2 may serve as a source junction. Each of the first and second doped semiconductor patterns CAP1 and CAP2 may include a doped silicon layer.

The barrier patterns BP may be formed on sidewalls of the stepped insulating layer SI. The barrier patterns BP and the stepped insulating layer SI may be covered with a planarized insulating pattern PD. A structure and a material of each of the barrier patterns BP and the stepped insulating layer SI may be the same as the structure and the material as described with reference to FIGS. 1A to 1D. The planarized insulating pattern PD and the stepped insulating layer SI may be penetrated by the supporting structures SP extending in the first direction I. The supporting structures SP may pass through the contact portions CTP_S and CTP_W of each of the first stepped stack structure SWS1 and the second stepped stack structure SWS2. According to an embodiment, the supporting structures SP may pass through at least one of the conductive patterns DSL, WLd, SSL, and WLs.

An etch stop layer ES and first, second, and third upper insulating layers UI1, UI2, and UI3 may be stacked on the planarized insulating pattern PD. The etch stop layer ES may include a nitride layer. The first upper insulating layer UI1 may be formed on the etch stop layer ES and may include an oxide layer. The etch stop layer ES and the first upper insulating layer UI1 may be penetrated by contact plugs CT1, CT2, SCT, and WCT.

The contact plugs CT1, CT2, SCT, and WCT may include the first and second contact plugs CT1 and CT2 disposed at a cell region CAR and the select contact plug SCT and the word contact plugs WCT disposed at the contact region CTR. The first contact plug CT1 may contact the first doped semiconductor pattern CAP1. The second contact plug CT2 may contact the second doped semiconductor pattern CAP2. The select contact plug SCT may contact a select line (e.g., the SSL). The word contact plugs WCT may contact word lines (e.g., the WLs). The select contact plug SCT and the word contact plugs WCT may further pass through the planarized insulating pattern PD and the stepped insulating layer SI. Each of the barrier patterns BP may be disposed between a contact plug and a supporting structure neighboring each other. In other words, one of the barrier patterns BP may be disposed between one of the contact plugs (SCT and WCT) and one of the supporting structures SP disposed at the contact region CTR.

A common source line CSL and first connecting wires LL1 may be formed on the first upper insulating layer UI1. The common source line CSL may be coupled to the second contact plug CT2, and the first connecting wires LL1 may be coupled to the contact plugs SCT and WCT disposed at the contact region CTR, respectively. Each of the first connecting wires LL1 may serve as a pad to increase a contact margin.

The common source line CSL and the first connecting wires LL1 may pass through the second upper insulating layer UI2 stacked on the first upper insulating layer UI1.

The third upper insulating layer UI3 formed on the second upper insulating layer UI2 may be penetrated by upper contact plugs UCT. Each of the upper contact plugs UCT may contact each of the first connecting wires LL1.

The first connecting wires LL1 may be coupled to second connecting wires LL2 formed on the third upper insulating layer UI3 via the upper contact plugs UCT, respectively. The second connecting wires LL2 may be disposed on the same layer as a bit line BL. The bit line BL may be electrically coupled to the first doped semiconductor pattern CAP1 via the first contact plug CT1 extending to pass through the second and third upper insulating layers UI2 and UI3.

According to the structure illustrated in FIG. 5, a drain select transistor may be formed at an intersection of the first vertical channel VCH1 and the drain select line DSL and drain side memory cells may be formed at intersections of the first vertical channel VCH1 and the drain side word lines WLd. The drain side memory cells and the drain select transistor may be coupled in series by the first vertical channel VCH1.

In addition, a source select transistor may be formed at an intersection of the second vertical channel VCH2 and the source select line SSL and source side memory cells may be formed at intersections of the second vertical channel VCH2 and the source side word lines WLs. The source side memory cells and the source select transistor may be coupled in series by the second vertical channel VCH2.

The source side memory cells and the drain side memory cells may be coupled in series by a pipe transistor formed at an intersection of the pipe channel PCH and the pipe gate PG.

Consequently, the memory string MCR illustrated in FIG. 5 may include the drain select transistor, the drain side memory cells, the pipe transistor, the source side memory cells, and the source select transistor which are coupled in series by the channel layer CH including the pipe channel PCH, the first vertical channel VCH1, and the second vertical channel VCH2.

FIGS. 6A to 6F are cross-sectional diagrams illustrating a method of manufacturing a three-dimensional semiconductor device according to an embodiment of the present disclosure. The method of manufacturing illustrated in FIGS. 6A to 6F may be used for forming the semiconductor device illustrated in FIG. 5. FIGS. 6A to 6F are cross-sectional diagrams taken along the second direction II shown in FIG. 5 and which illustrate manufacturing processes. FIGS. 6A to 6F illustrate a cross section extending to a portion of a peripheral region PERI, A peripheral circuit for controlling memory strings may be disposed at the peripheral region PERI.

Figure 6A:
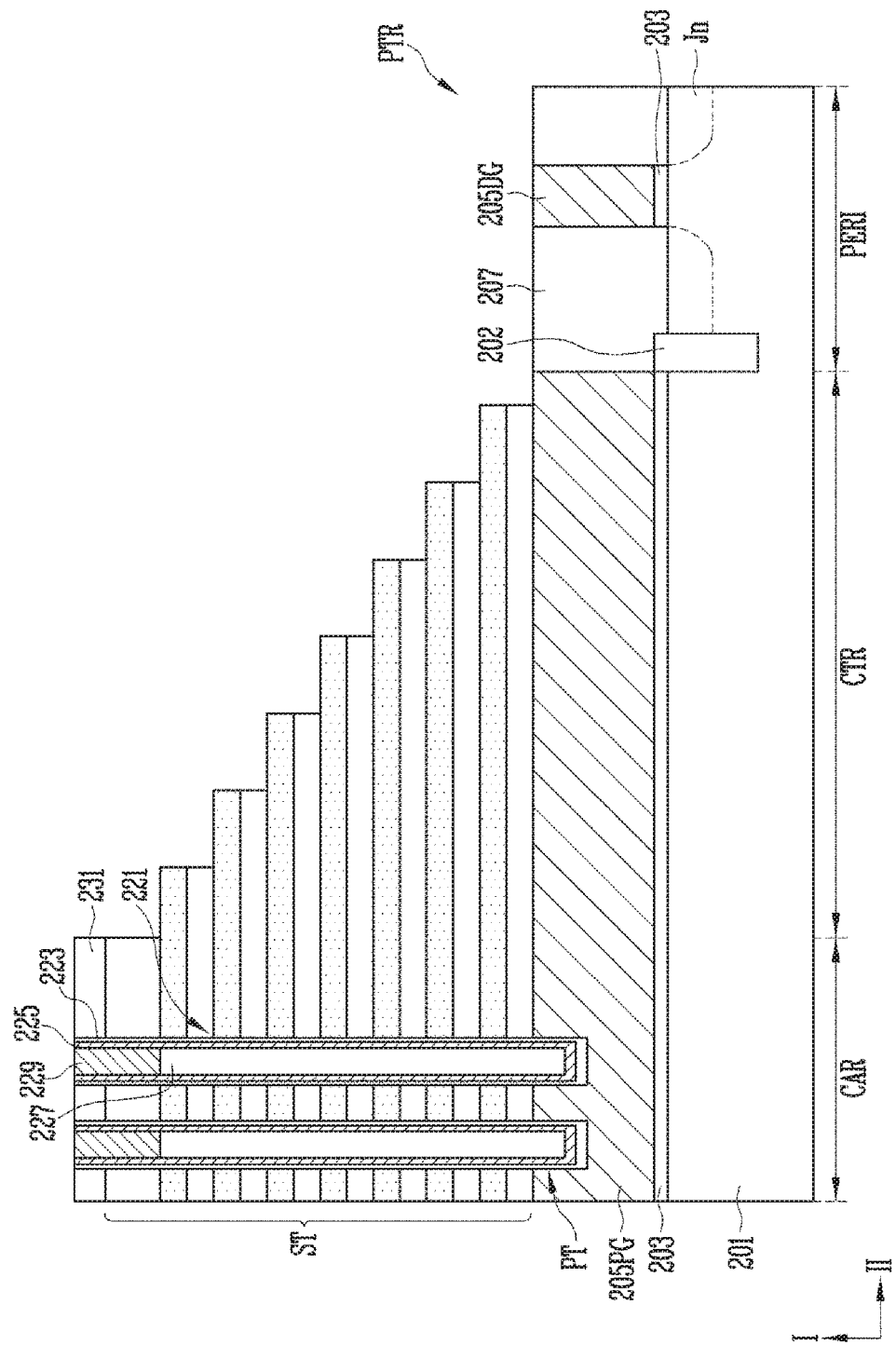
FIGS. 6A, 6B, 6C, 6D, 6E, and 6F are cross-sectional diagrams illustrating a method of manufacturing a three-dimensional semiconductor device according to an embodiment of the present disclosure.

Referring to FIG. 6A, an active region may be defined by an isolation layer 202 and a semiconductor substrate 201 on which a gate insulating layer 203 is disposed and formed. Thereafter, a first conductive layer may be formed on the gate insulating layer 203. Thereafter, the first conductive layer may be divided into a pipe gate 205PG and a driving gate 205DG by patterning the first conductive layer. The driving gate 205DG may serve as a gate electrode of a driving transistor PTR which constitutes the peripheral circuit. Thereafter, junction regions Jn may be formed by injecting an n type or p type impurity into the semiconductor substrate 201 at both sides of the driving gate 205DG.

Thereafter, a lower insulating layer 207 insulating the pipe gate 205PG and the driving gate 205DG from each other may be formed. Subsequently, a pipe trench PT may be formed in the pipe gate 205PG.

Thereafter, the stepped stack structure ST described with reference to FIG. 4A may be formed on the pipe gate 205PG including the pipe trench PT. The stepped stack structure ST may extend from the cell array region CAR of the semiconductor substrate 201 to the contact region CTR. The stepped stack structure ST may be patterned not to overlap the peripheral region PERI of the semiconductor substrate 201.

Subsequently, the stepped stack structure ST may be etched by an etching process in which a mask pattern 231 formed on the stepped stack structure ST serves as an etching barrier. Thereby, a channel hole 221 passing through the stepped stack structure ST and coupled to the pipe trench PT may be formed.

Thereafter, a multilayer memory layer 223 and a channel layer 225 may be formed in sequence on a surface of the channel hole 221 and the pipe trench PT. For example, the multiplayer memory layer 223 and the channel layer 225 passing through the stepped stack structure ST may be formed. A central portion of the channel hole 221 and the pipe trench PT may be completely filled with the channel layer 225. When the central portion of the channel hole 221 and the pipe trench PT is not completely filled with the channel layer 225, the central portion of the channel hole 221 and the pipe trench PT may be filled with a core insulating layer 227. The core insulating layer 227 may be recessed to have a lower height than the channel hole 221. An upper end of the channel hole 221 which is exposed by recessing the core insulating layer 227 may be filled with a doped semiconductor pattern 229.

Referring to FIG. 6B, a stepped insulating layer 233 described with reference to FIG. 4A may be formed after removing the mask pattern 231 illustrated in FIG. 6A. Subsequently, barrier patterns 241P may be formed using the processes described with reference to FIGS. 4B and 4C.

Thereafter, an insulating layer 251 covering the stepped insulating layer 233 and the barrier patterns 241P may be formed. The insulating layer 251 may be thick enough to completely bury the steps defined by the stepped insulating layer 233 and the stepped stack structure ST. The insulating layer 251 may include an oxide.

Referring to FIG. 6C, a portion of the insulating layer may be etched by an etching process using a mask pattern (not illustrated) blocking the peripheral region PERI as an etching barrier to decrease the step of the insulating layer 251 of FIG. 6B caused by the stepped stack structure ST. Thereby, an insulating pattern 251P1 may be formed. After forming the insulating pattern 251P1, the mask pattern may be removed.

Referring to FIG. 6D, to further planarize a surface of the insulating pattern 251P1 illustrated in FIG. 6C, the surface of the insulating pattern 251P1 may be polished by a planarizing process such as Chemical Mechanical Polishing (CMP). Thereby, a planarized insulating pattern 251P2 may be formed. The planarizing process may be performed to expose the doped semiconductor pattern 229 and a portion of a surface of the stepped insulating layer 233. An uppermost pattern TP among the barrier patterns 241P may be also polished when the planarized insulating pattern 251P2 is polished.

Figure 6E:
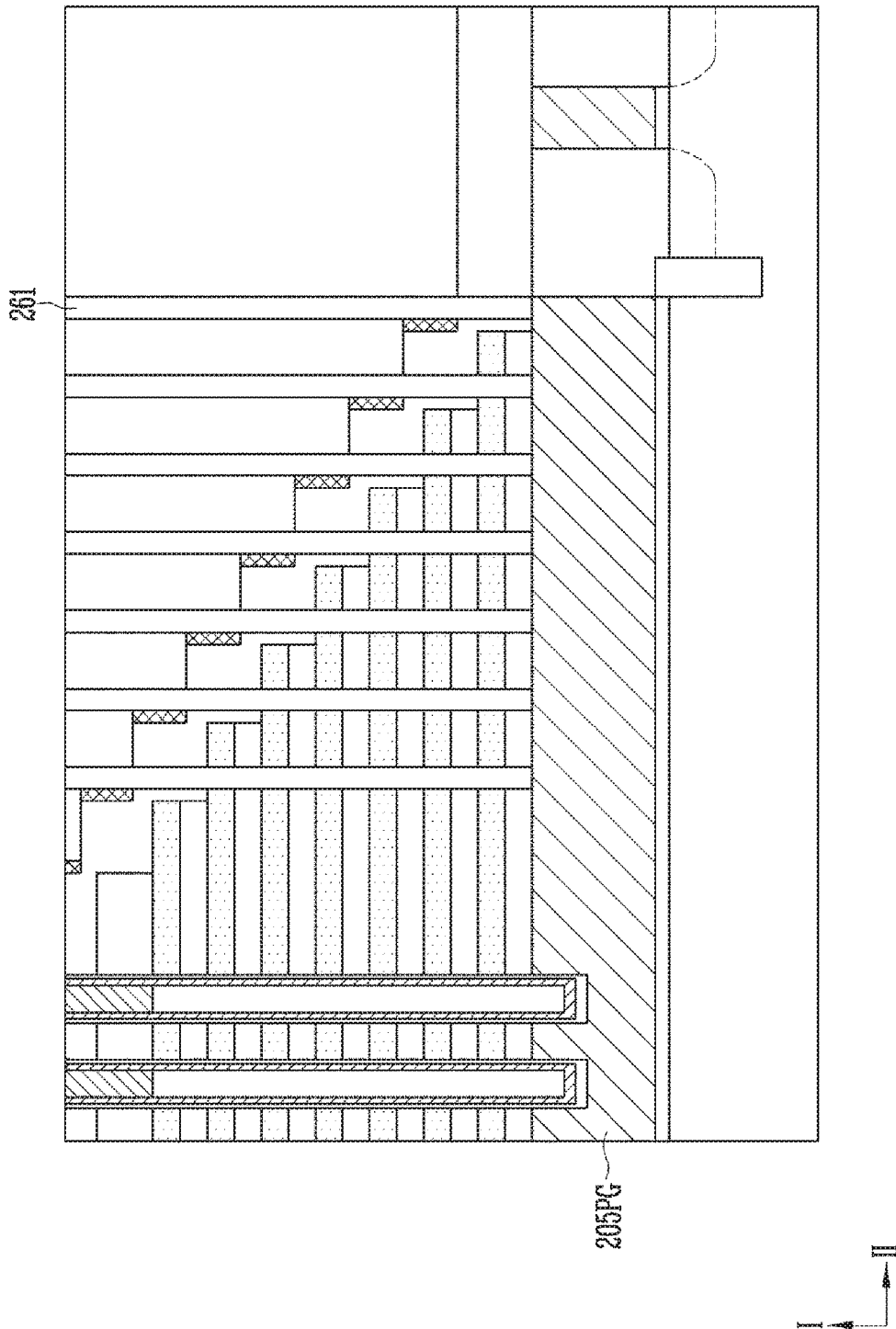
Figure 6I:
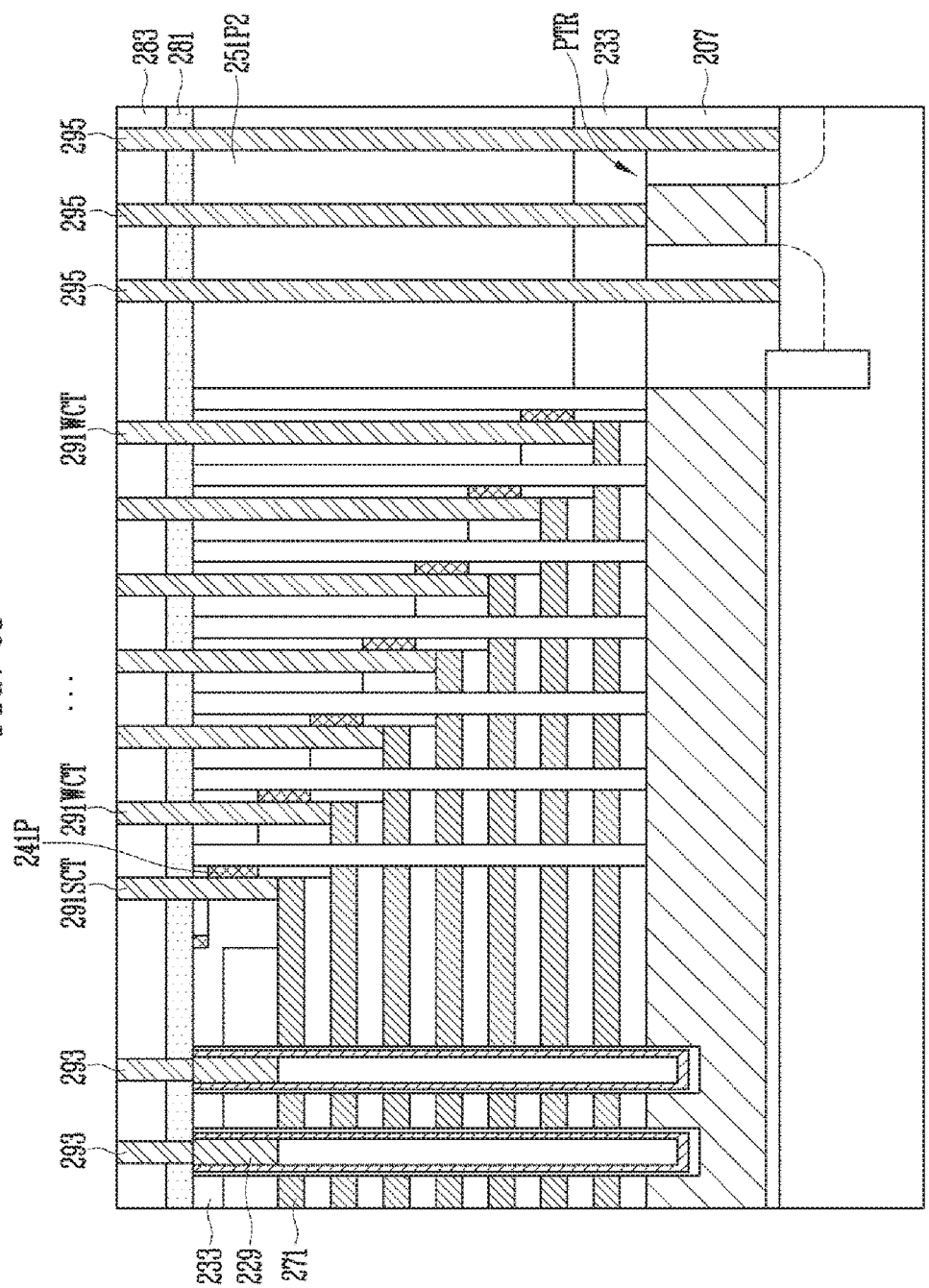

Referring to FIG. 6E, supporting structures 261 may be formed in the same manner as described with reference to FIG. 4E. The supporting structures 261 may be aligned on the pipe gate 205PG.

Referring to FIG. 6F, a portion of the material layers of the stepped stack structure may be replaced with conductive patterns 271 by using the processes described with reference to FIGS. 4E and 4F.

Subsequently, an etch stop layer 281 extending to overlap the planarized insulating pattern 251P2 and the stepped insulating layer 233 may be formed. The etch stop layer 281 may include a material having a different etch rate from that of the planarized insulating pattern 251P2 and the stepped insulating layer 233. For example, the planarized insulating pattern 251P2 and the stepped insulating layer 233 may include oxide layers, and the etch stop layer 281 may include a nitride layer.

Thereafter, an upper insulating layer 283 maybe formed on the etch stop layer 281. The upper insulating layer 283 may include a material having a different etch rate from that of the etch stop layer 281, for example, an oxide layer.

Thereafter, contact plugs 291SCT, 291WCT, 293, and 295 may be formed. The contact plugs 291SCT, 291WCT, 293, and 295 may pass through the upper insulating layer 283 and the etch stop layer 281. The contact plugs 291SCT and 291WCT coupled to the conductive patterns 271 and the contact plugs 295 coupled to the driving transistor PTR may extend to further pass through the planarized insulating pattern 251P2 and the stepped insulating layer 233. The contact plugs 295 coupled to the driving transistor PTR may extend to further pass through the lower insulating layer 207.

The contact plugs 291SCT and 291WCT may be disposed to have one of the layouts described with reference to FIGS. 1A to 1D. When the contact plugs 291SCT and 291WCT are formed, the barrier patterns 241P may serve as etch stop layers.

Subsequently, subsequent processes for forming the common source line CSL, the first connecting wires LL1, the upper contact plug UCT, the bit lines BL, and the second connecting wires LL2 which are illustrated in FIG. 5 may proceed.

Figure 7A:
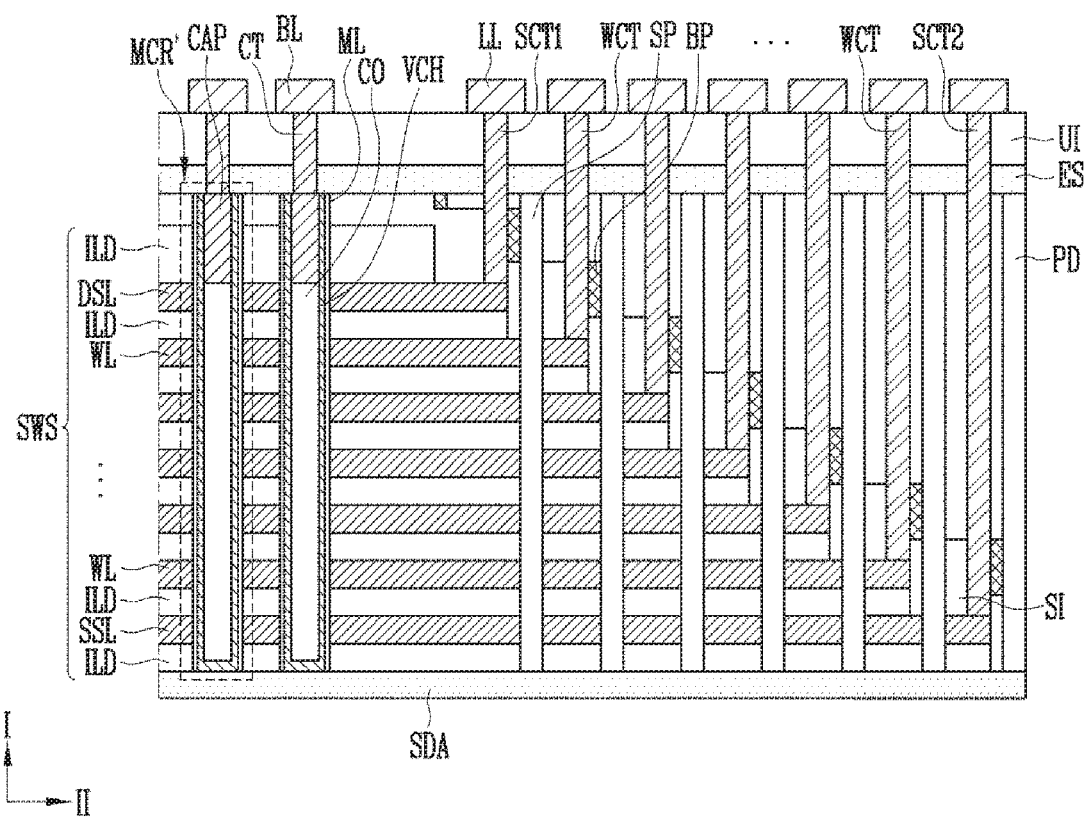
FIGS. 7A, 7B, and 7C are cross-sectional diagrams illustrating a three-dimensional semiconductor device according to various embodiments of the present disclosure.
Figure 7B:
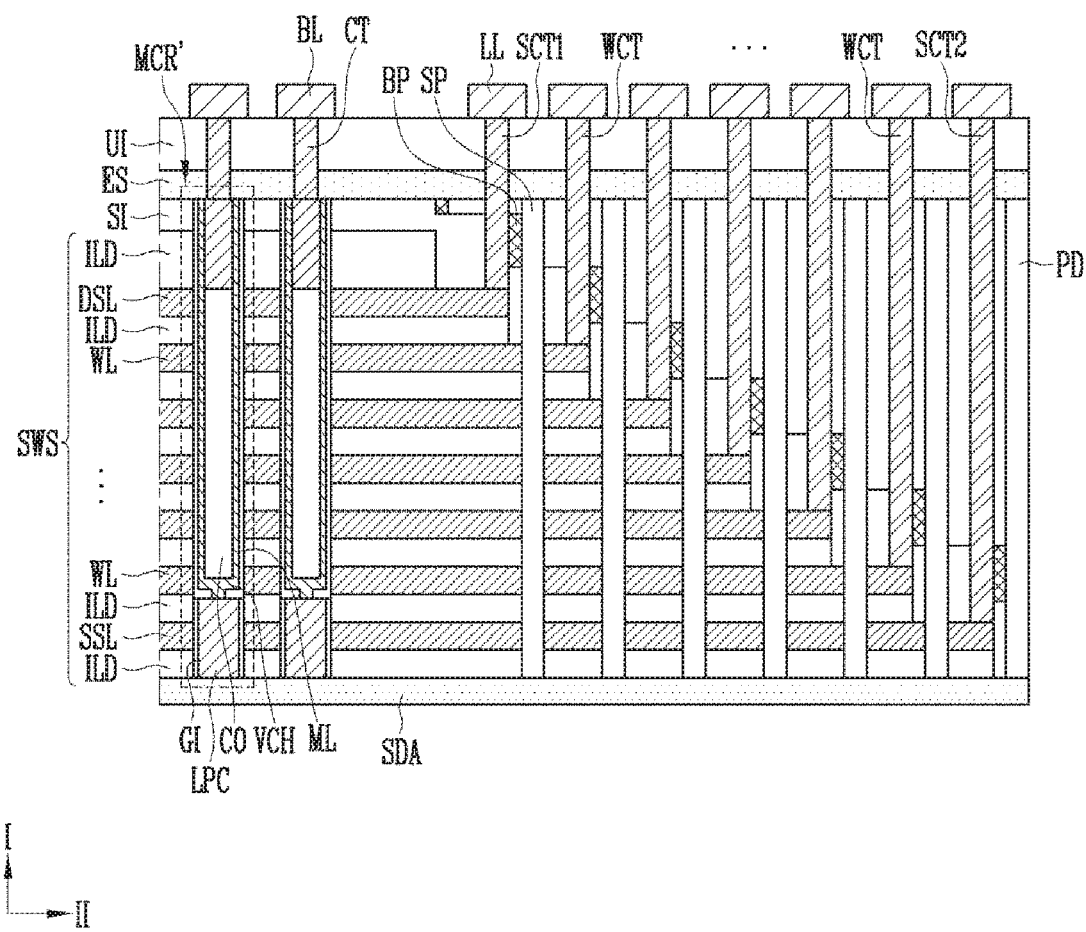
Figure 7C:
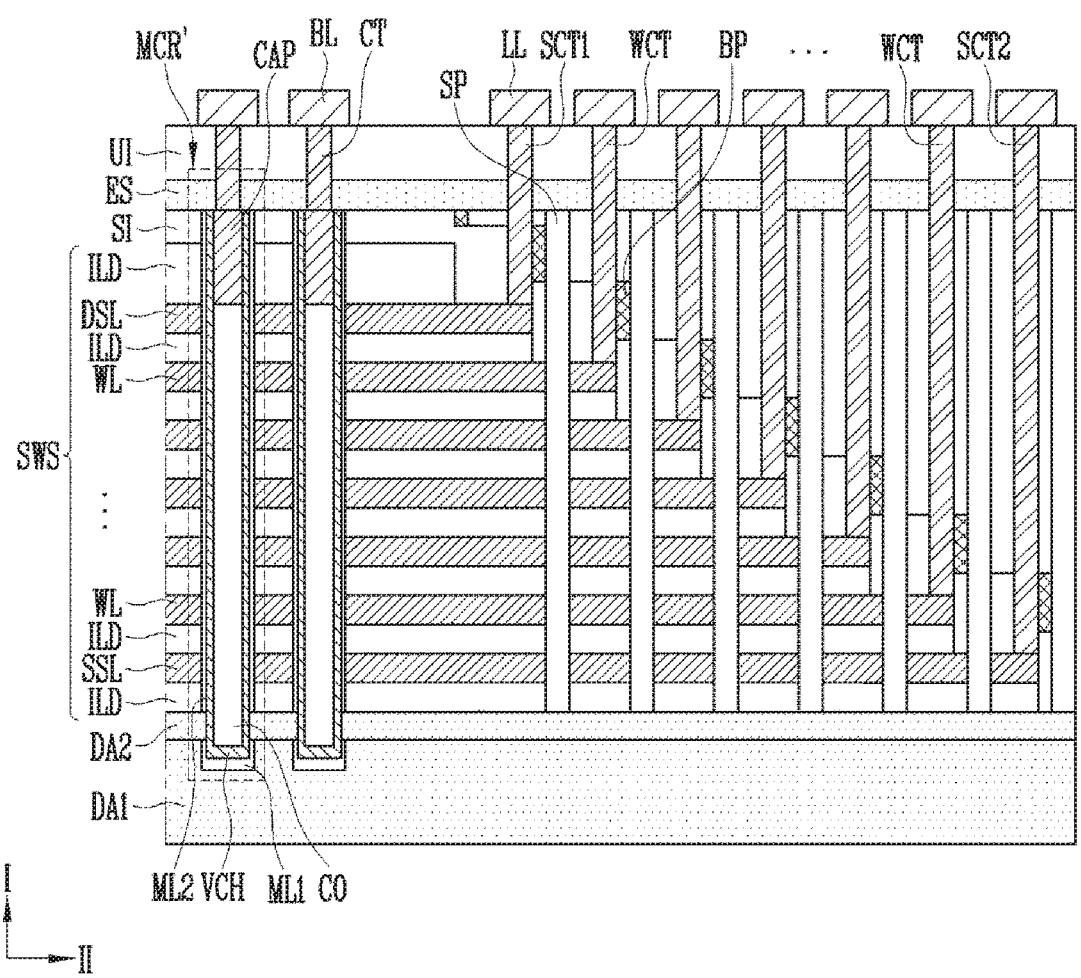

FIGS. 7A to 7C are cross-sectional diagrams illustrating a three-dimensional semiconductor device according to various embodiments of the present disclosure.

Referring to FIGS. 7A to 7C, the three-dimensional semiconductor device may include a memory string MCR' in a straight type. The memory string MCR' may include the vertical channel VCH passing through at least a portion of the stepped stack structure SWS.

The stepped stack structure SWS may include the interlayer insulating layers ILD and the conductive patterns SSL, WL, and DSL alternately stacked on each other. More specifically, the conductive patterns of the stepped stack structure SWS may include the word lines WL stacked to be spaced apart from each other, at least one drain select line DSL disposed above the word lines WL, and at least one source select line SSL disposed under the word lines WL. The stepped stack structure SWS may be covered by the stepped insulating layer SI.

Referring to FIG. 7A, the vertical channel VCH may completely pass through the stepped stack structure SWS. The vertical channel VCH may include a bottom surface directly contacting the source dopant region SDA disposed under the stepped stack structure SWS.

Referring to FIG. 7B, the vertical channel UCH may be coupled to the source dopant region SDA disposed under the stepped stack structure SWS via a lower channel LPC disposed under the vertical channel VCH. The vertical channel VCH may completely pass through the word lines WL of the stepped stack structure SWS and the lower channel LPC may completely pass through the source select line SSL. The lower channel LPC may be formed using a growth method such as an epitaxial growth method in which the source dopant region SDA serves as a seed layer or using a deposition method of a semiconductor layer. The lower channel LPC may serve as a channel of the source select transistor and a sidewall of the lower channel LPC may be surrounded by a gate insulating layer GI. The lower channel LPC may include a doped semiconductor layer.

The source dopant region SDA illustrated in FIGS. 7A and 7B may include a doped semiconductor layer and serve as a source junction or a common source line. A sidewall of the vertical channel UCH illustrated in FIGS. 7A and 7B may be surrounded by the multilayer memory layer ML described above with reference to FIG. 2B.

Referring to FIG. 7C, the vertical channel VCH may extend into the first dopant region DA1 and a second dopant region DA2 disposed under the stepped stack structure SWS. The first and second dopant regions DA1 and DA2 may be doped with a source dopant or a well dopant. For example, each of the first and second dopant regions DA1 and DA2 may include a doped semiconductor layer doped with an n type dopant or a doped semiconductor layer doped with a p type dopant. The vertical channel VCH may include a sidewall directly contacting the second dopant region DA2. The second dopant region DA2 may pass through a side portion of a multilayer memory layer extending along an outer wall of the vertical channel VCH. Thereby, the multilayer memory layer may be divided into a first multilayer memory pattern ML1 and a second multilayer memory pattern ML2. Each of the first multilayer memory pattern ML1 and the second multilayer memory pattern ML2 may include the same material layers as the multilayer memory layer described above with reference to FIG. 2B.

Referring to FIGS. 7A to 7C, the vertical channel VCH may include a semiconductor layer, a core region of the vertical channel VCH may be filled with the core insulating layer CO. The core insulating layer CO may have a lower height than the vertical channel VCH. A doped semiconductor pattern CAP may be disposed on the core insulating layer CO. The doped semiconductor pattern CAP may serve as a drain junction.

The barrier patterns BP may be formed on the sidewalls of the stepped insulating layer SI. The barrier patterns BP and the stepped insulating layer SI may be covered with the planarized insulating pattern PD. A structure and a material of each of the barrier patterns BP and the stepped insulating layer SI may be the same as the structure and the material as described above with reference to FIGS. 1A to 1D. The planarized insulating pattern PD and the stepped insulating layer SI may be penetrated by the supporting structures SP extending in the first direction I.

The etch stop layer ES and an upper insulating layer UI may be stacked on the planarized insulating pattern PD. The etch stop layer ES and the upper insulating layer UI may be penetrated by contact plugs CT, SCT1, SCT2, and WCT.

The contact plugs CT, SCT1, WCT, and SCT2 may include the bit contact plug CT contacting the doped semiconductor pattern CAP, the first select contact plug SCT1 contacting the drain select line DSL, the second select contact plug SCT2 contacting the source select line SSL, and the word contact plugs WCT respectively contacting the word lines WL. The first and second select contact plugs SCT1 and SCT2 and the word contact plugs WCT may further pass through the planarized insulating pattern PD and the stepped insulating layer SI.

The bit line BL and connecting wires LL may be formed on the upper insulating layer UI. The bit line BL may be coupled to the bit contact plug CT and the connecting wires LL may be coupled to the first select contact plug SCT1, the second select contact plug SCT2, and the word contact plugs WCT, respectively.

According to the structure illustrated in FIGS. 7A to 7C, the memory string MCR' may include memory cells which are coupled in series along each of the vertical channels VCH. The memory cells may be formed at intersections of each vertical channel VCH and the word lines WL. In addition, the memory string MCR' may include a drain select transistor coupled in series to the memory cells by the vertical channel VCH. The drain select transistor may be formed at an intersection of each vertical channel VCH and the drain select line DSL. In addition, the memory string MCR' may include a source select transistor coupled in series to the memory cells by the vertical channel VCH or the lower channel LPC. The source select transistor may be formed at an intersection of each vertical channel VCH and the source select line SSL or an intersection of the lower channel LPC and the source select line SSL.

The three-dimensional semiconductor device illustrated in FIGS. 7A to 7C may be formed by the manufacturing processes illustrated in FIGS. 4A to 4H or the manufacturing processes illustrated in FIGS. 6A to 6F.

According to the present disclosure, when the contact plug is formed, even when the alignment position of the contact plug moves in a horizontal direction, the contact plug may overlap the barrier pattern and might not pass through the barrier pattern. In other words, according to the present disclosure, misalignment between the contact plug and the contact portion of the conductive pattern may be prevented by the barrier pattern. Thereby, according to the present disclosure, since bridges between different conductive patterns may be prevented using the barrier pattern, operational reliability of a semiconductor device may be improved.

Figure 8:
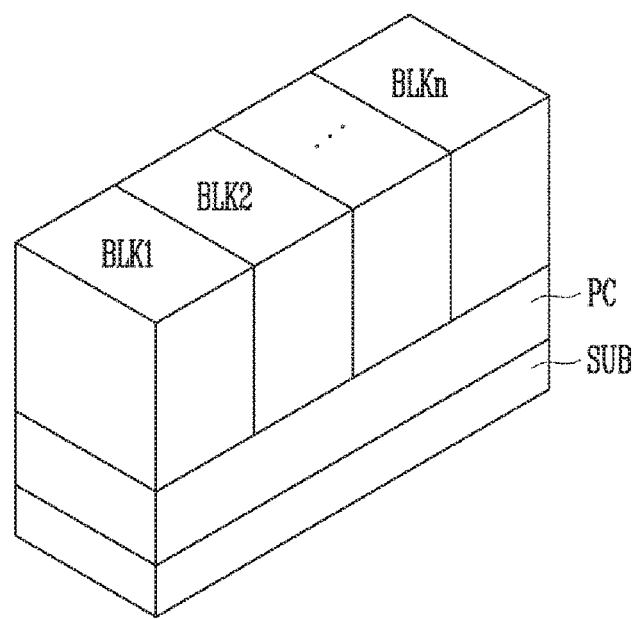
FIG. 8 is a block diagram illustrating a semiconductor device according to an embodiment of the present disclosure.

FIG. 8 is a block diagram illustrating a semiconductor device according to an embodiment of the present disclosure.

Referring to FIG. 8, the semiconductor device according to embodiments of the present disclosure may include a substrate SUB, a peripheral circuit structure PC disposed on the substrate SUB, and memory blocks BLK1 to BLKn disposed on the peripheral circuit structure PC.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method. Each of the memory blocks BLK1 to BLKn may include a stepped stack structure coupled to at least one of the memory strings illustrated in FIGS. 5 and 7A to 7C.

The peripheral circuit structure PC may include a row decoder, a column decoder, a page buffer, and a control circuit. The peripheral circuit structure PC may include NMOS and PMOS transistors, a resistor, and a capacitor which are electrically coupled to the memory blocks BLK1 to BLKn. The peripheral circuit structure PC may overlap the stepped stack structure of the memory blocks BLK1 to BLKn.

Figure 9:
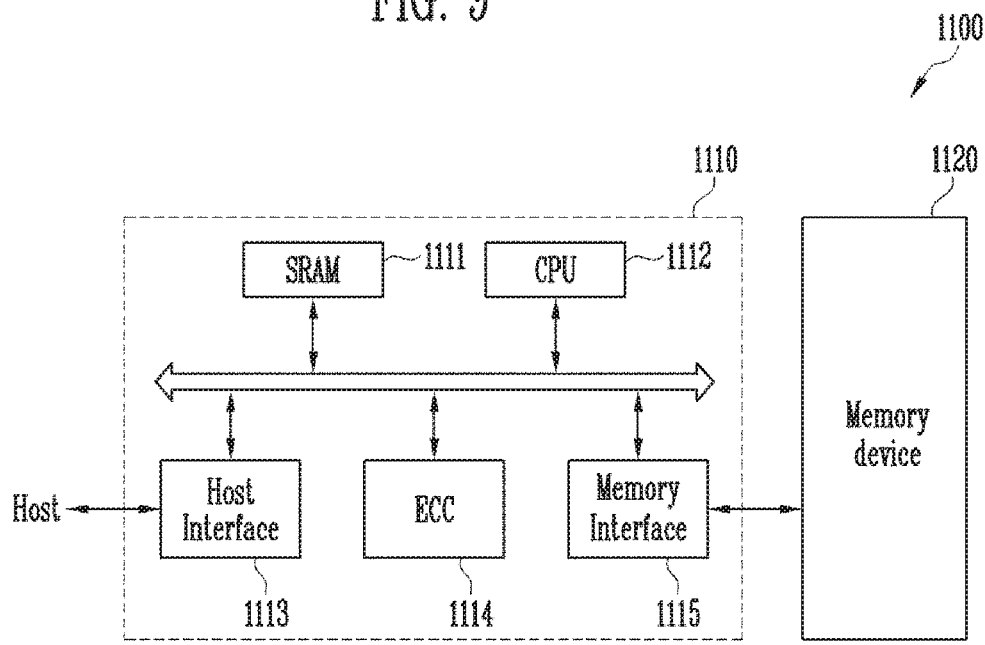
FIG. 9 is a block diagram illustrating the configuration of a memory system according to an embodiment of the present disclosure.

FIG. 9 is a block diagram illustrating the configuration of a memory system 1100 according to an embodiment of the present disclosure.

Referring to FIG. 9, the memory system 1100 according to an embodiment of the present disclosure may include a memory device 1120 and a memory controller 1110.

The memory device 1120 may be a multi-chip package formed of a plurality of flash memory chips.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112. The CPU 1112 may perform overall control operations for data exchange of the memory controller 1110. The host interface 1113 may include a data exchange protocol for a host connected with the memory system 1100. In addition, the ECC 1114 may detect and correct errors included in the data read from the memory device 1120, and the memory interface 1115 may perform interfacing with the memory device 1120. In addition, the memory controller 1110 may further include a Read Only Memory (ROM) for storing code data for interfacing with the host.

The above-described memory system 1100 may be a memory card or a Solid State Disk (SSD) equipped with the memory device 1120 and the memory controller 1110. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (DATA), a Small Computer Small Interface (SCSI), an Enhanced Small Disk Interface (ESDI), an Integrated Drive Electronics (IDE), etc.

Figure 10:
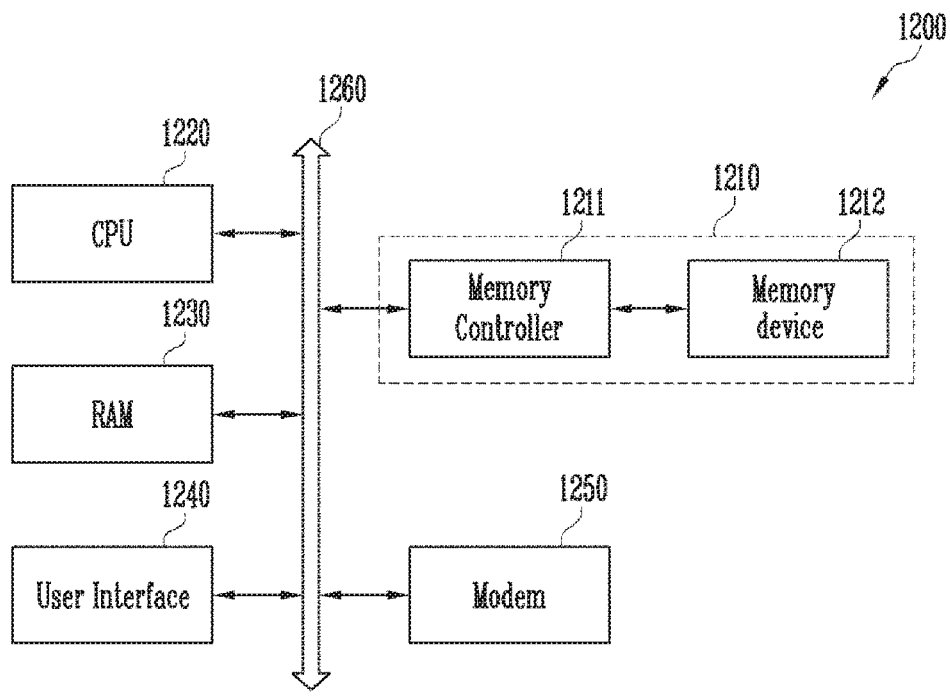
FIG. 10 is a block diagram illustrating the configuration of a computing system according to an embodiment of the present disclosure.

FIG. 10 is a block diagram illustrating the configuration of a computing system 1200 according to an embodiment of the present disclosure.

Referring to FIG. 10, the computing system 1200 according to an embodiment of the present disclosure may include a CPU 1220, a Random Access Memory (RAM) 1230, a user interface 1240, a modem 1250, and a memory system 1210 which are electrically coupled to a system bus 1260. In addition, when the computing system 1200 is a mobile device, a battery for supplying an operating voltage to the computing system 1200 may be further included and an application chipset, a camera image processor (CIS), a mobile DRAM, and the like may be further included.

The memory system 1210 may include a memory device 1212 and a memory controller 1211.

The above-discussed embodiments aim to help those with ordinary knowledge in this art to more clearly understand the present disclosure rather than aiming to limit the bounds of the present disclosure. It should be understood that many variations and modifications of the basic concepts described herein will still fall within the spirit and scope of the present disclosure as defined in the accompanying claims and equivalents thereof.

So far as not being differently defined, all terms used herein including technical or scientific terminologies have meanings that are commonly understood by those skilled in the art to which the present disclosure pertains. So far as not being dearly defined in this application, terms should not be understood in an ideally or excessively formal way.

What is claimed is:

1. A semiconductor device, comprising:
   conductive patterns, wherein the conductive patterns are stacked and spaced apart from each other in a first direction to form a stepped structure;
   a stepped insulating layer overlapping the stepped structure;
   contact plugs extending through the stepped insulating layer in the first direction to contact respective contact portions of the conductive patterns exposed by the stepped structure; and
   barrier patterns disposed on sidewalls of the stepped insulating layer.

2. The semiconductor device of claim 1, wherein interfaces between the sidewalls of the stepped insulating layer and the barrier patterns are aligned with sidewalls of the conductive patterns, respectively.

3. The semiconductor device of claim 1, wherein the barrier patterns are spaced apart from each other in a direction in which the contact portions extend.

4. The semiconductor device of claim 1, wherein the barrier patterns are disposed at different levels in the first direction.

5. The semiconductor device of claim 1, wherein each of the contact plugs is disposed between neighboring barrier patterns of the barrier patterns.

6. The semiconductor device of claim 1, wherein the barrier patterns include a first barrier pattern disposed at a first side of a first contact plug of the contact plugs and a second barrier pattern disposed at a second side of the first contact plug, and wherein the first and second sides are opposite sides of the first contact plug.

7. The semiconductor device of claim 6, wherein the first contact plug contacts a sidewall of one of the first and second barrier patterns and is spaced apart from the other of the first and second barrier patterns.

8. The semiconductor device of claim 6, wherein the first contact plug is spaced apart from the first and second barrier patterns.

9. The semiconductor device of claim 6, wherein the first contact plug comprises:

a first portion extending along a sidewall of one of the first and second barrier patterns and spaced apart from the other of the first and second barrier patterns; and a second portion protruding from the first portion and overlapping a top surface of the one of the first and second barrier patterns.

10. The semiconductor device of claim 1, wherein a width of each of the barrier patterns is smaller than a width of each of the contact portions in a direction in which the contact portions extend.

11. The semiconductor device of claim 1, wherein the barrier patterns include a material different from that of the stepped insulating layer.

12. The semiconductor device of claim 1, wherein the barrier patterns include at least one of polysilicon, a nitride layer, a titanium nitride layer, and a metal layer.

13. The semiconductor device of claim 1, further comprising:

interlayer insulating layers disposed between the conductive patterns;

a channel layer passing through the interlayer insulating layers and the conductive patterns; and a multilayer memory layer disposed between each of the conductive patterns and the channel layer.

14. The semiconductor device of claim 1, further comprising supporting structures extending in the first direction through at least one of the conductive patterns, wherein at least one of the barrier patterns is disposed between one of the supporting structures and one of the contact plugs.

\* \* \* \* \*